United States Patent
Chen et al.

(10) Patent No.: US 11,652,011 B2
(45) Date of Patent: May 16, 2023

(54) METHOD TO MANUFACTURE SEMICONDUCTOR DEVICE

(71) Applicant: AP Memory Technology Corp., Zhubei (TW)

(72) Inventors: Wen Liang Chen, Zhubei (TW); Lin Ma, Zhubei (TW); Chien-An Yu, Zhubei (TW); Chun Yi Lin, Zhubei (TW)

(73) Assignee: AP Memory Technology Corp., Zhubei (TW)

( * ) Notice: Subject to any disclaimer, the term of this patent is extended or adjusted under 35 U.S.C. 154(b) by 0 days.

(21) Appl. No.: 17/401,010

(22) Filed: Aug. 12, 2021

(65) Prior Publication Data

US 2021/0375705 A1    Dec. 2, 2021

Related U.S. Application Data

(63) Continuation of application No. 16/899,166, filed on Jun. 11, 2020, now Pat. No. 11,158,552, which is a
(Continued)

(51) Int. Cl.
*H01L 23/522*    (2006.01)
*H01L 21/66*    (2006.01)
(Continued)

(52) U.S. Cl.
CPC .............. *H01L 22/34* (2013.01); *H01L 22/10* (2013.01); *H01L 23/5226* (2013.01);
(Continued)

(58) Field of Classification Search
CPC ... H01L 23/00; H01L 23/522; H01L 23/5226; H01L 24/04; H01L 24/05; H01L 24/08;
(Continued)

(56) References Cited

U.S. PATENT DOCUMENTS 5,939,782 A    8/1999    Malladi
7,602,002 B2    10/2009    Inoue et al.
(Continued)

FOREIGN PATENT DOCUMENTS

WO    2018198330 A1    11/2018
WO    2020/005333 A1    1/2020

OTHER PUBLICATIONS

Taiwanese Office Action, dated Oct. 29, 2021, in a counterpart Taiwanese patent application, No. TW 110113790. (Concise Summary of Taiwanese Office Communication and English translation of the search report are appended after the Chinese language document in the same PDF.).
(Continued)

*Primary Examiner* — Chuong A Luu
(74) *Attorney, Agent, or Firm* — Chen Yoshimura LLP

(57) ABSTRACT

A method to manufacture a semiconductor device includes: bonding a first wafer and a second wafer to be stacked vertically with one another, in which the first wafer provides a plurality of memory components and the second wafer provides a control circuit; forming a plurality of input/output channels on a surface of one of the first and second wafers; and cutting the bonded first and second wafers into a plurality of dices; wherein a plurality of first conductive contacts in the first wafer are electrically connected to the control circuit and the first conductive contacts in combinations with a plurality of first conductive vias in the first wafer form a plurality of transmission channels through which the control circuit is capable to access the memory components.

20 Claims, 16 Drawing Sheets

Related U.S. Application Data continuation-in-part of application No. 16/232,417, filed on Dec. 26, 2018, now Pat. No. 10,811,402.

(60) Provisional application No. 63/021,608, filed on May 7, 2020.

(51) Int. Cl.
*H01L 25/18* (2023.01)
*H01L 23/00* (2006.01)

(52) U.S. Cl.
CPC .............. *H01L 24/19* (2013.01); *H01L 24/20* (2013.01); *H01L 25/18* (2013.01)

(58) Field of Classification Search
CPC ......... H01L 24/13; H01L 24/29; H01L 24/32; H01L 24/20; H01L 24/19; H01L 24/81; H01L 24/83; H01L 24/80; H01L 24/94; H01L 22/10; H01L 22/34; H01L 21/768; H01L 21/76898; H01L 25/00; H01L 25/18; H01L 25/50; H01L 27/06; H01L 27/0688; H01L 2224/056; H01L 2224/09181; H01L 2224/09517; H01L 2224/13025; H01L 2224/131; H01L 2224/29186; H01L 2224/32145; H01L 2224/80896; H01L 2224/81191; H01L 2224/83896; H01L 2224/08145; H01L 2224/80895; H01L 2924/013; H01L 2924/00014
USPC .......................................... 438/406, 455, 458
See application file for complete search history.

(56) References Cited

U.S. PATENT DOCUMENTS

| | | | |
|---|---|---|---|
| 8,845,854 | B2 | 9/2014 | Lei et al. |
| 9,130,057 | B1 | 9/2015 | Kumar et al. |
| 9,230,941 | B2 | 1/2016 | Chen et al. |
| 9,502,434 | B2 | 11/2016 | Tanaka et al. |
| 10,510,634 | B2 | 12/2019 | Lin et al. |
| 10,600,781 | B1 | 3/2020 | Xiao et al. |
| 2008/0203443 | A1 | 8/2008 | Wilson et al. |
| 2015/0318246 | A1 | 11/2015 | Yu et al. |
| 2015/0339201 | A1 | 11/2015 | Kanekawa et al. |
| 2016/0012865 | A1 | 1/2016 | Lee et al. |
| 2016/0155722 | A1* | 6/2016 | Leedy ................. H01L 27/0688 257/686 |
| 2016/0336990 | A1* | 11/2016 | Petzold ............. H01L 29/78654 |
| 2016/0358865 | A1 | 12/2016 | Shih et al. |
| 2017/0125436 | A1 | 5/2017 | Sharangpani et al. |
| 2019/0044764 | A1 | 2/2019 | Hollis et al. |
| 2019/0138412 | A1 | 5/2019 | Ogasawara |
| 2019/0304935 | A1 | 10/2019 | Collins et al. |
| 2020/0066668 | A1 | 2/2020 | Umemoto |
| 2020/0075534 | A1 | 3/2020 | Gao et al. |
| 2020/0098853 | A1 | 3/2020 | Haraguchi et al. |
| 2020/0103361 | A1 | 4/2020 | Wieczorek |
| 2020/0227366 | A1 | 7/2020 | Dogiamis et al. |
| 2020/0243455 | A1 | 7/2020 | Wang et al. |
| 2021/0134747 | A1 | 5/2021 | Yang |
| 2021/0242189 | A1 | 8/2021 | Or-Bach et al. |

OTHER PUBLICATIONS

Roozeboom et al., "Ultrahigh-density (> 0.4 μF/mm2) trench capacitors in silicon", First Int. Workshop on Power Supply on Chip (PowerSoC08), Cork, Ireland, Sep. 22-24, 2008.

Baker, "Benefits of Stacked-Wafer Capacitors for High-Frequency Buck Converters", Power SoC, Northeastern University, Boston, MA, Oct. 7, 2014.

Murata Manufacturing Co., Ltd., "3D Silicon Capacitors", CATSICAP1. 5, Feb. 24, 2020. Available at https://www.murata.com/-/media/webrenewal/products/capacitor/siliconcapacitors/pdf/silicon-capacitors-cataloguev15murata.pdf.

* cited by examiner

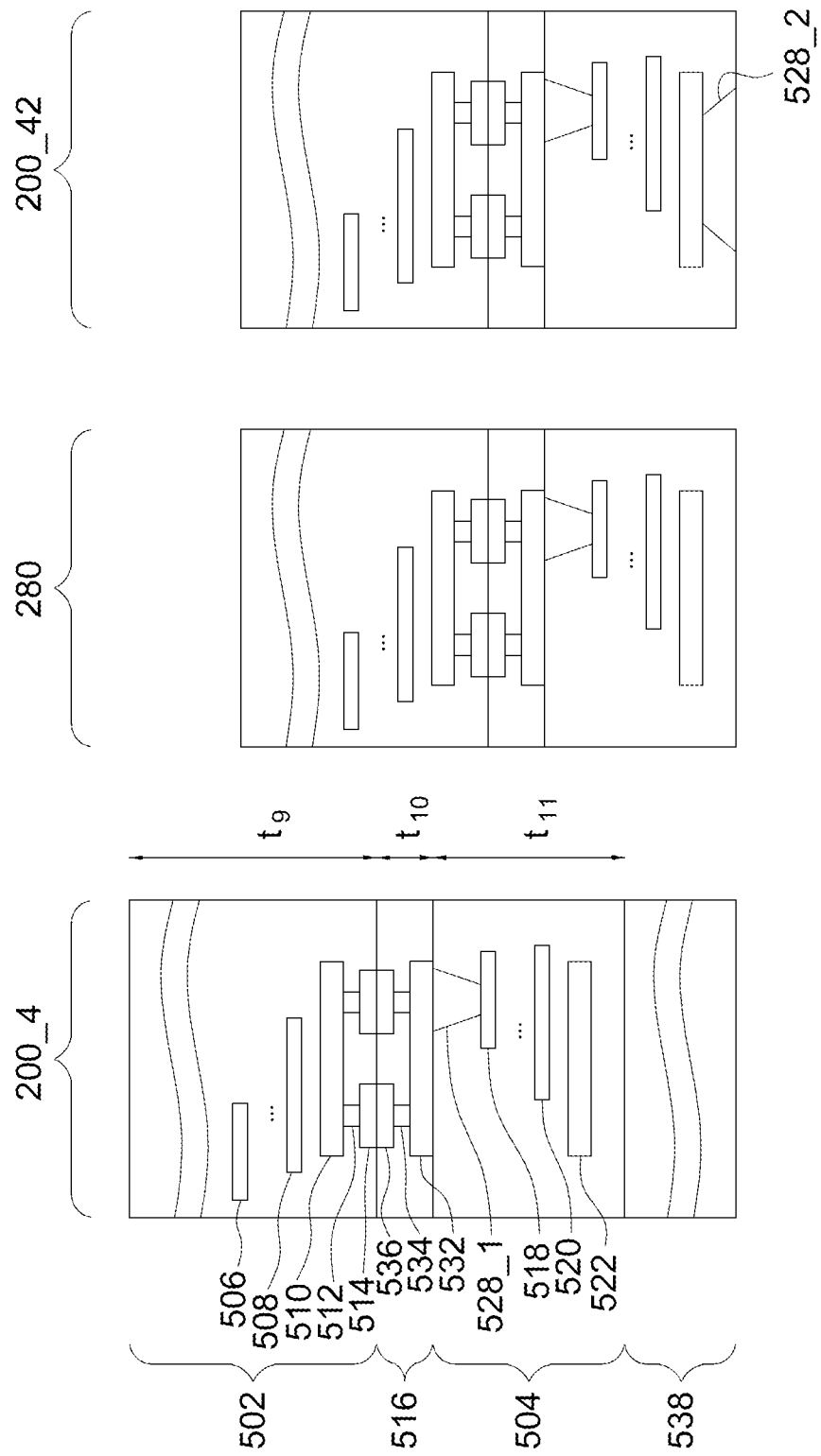

METHOD TO MANUFACTURE SEMICONDUCTOR DEVICE

PRIORITY CLAIM AND CROSS-REFERENCE

This application is a continuation application of pending U.S. applications Ser. No. 16/899,166, filed Jun. 11, 2020, which is a continuation-in-part of pending U.S. applications Ser. No. 16/232,417, filed Dec. 26, 2018, and the pending U.S. applications Ser. No. 16/899,166 also claims the benefit of U.S. Provisional Application No. 63/021,608, filed May 7, 2020, the entire contents of which is incorporated herein by reference.

FIELD OF THE INVENTION

The present invention generally relates to a semiconductor device and method to manufacture the same. Specifically, the present invention generally relates to a semiconductor device and method to manufacture the same comprising control circuit and memory components.

BACKGROUND OF THE INVENTION

Logic ICs (integrated circuit), such as CPU (Central Processing Unit), GPU (Graphics Processing Unit), AP (Application Processor), etc., perform various functionalities, such as complex arithmetical, logical and input/output operations in electric apparatuses, such as computer systems, mobile phones, etc. Memory ICs support logic ICs a storage space to store data through current chip-to-chip connections to the logic ICs. However, in conventional electric apparatuses, the latency and bandwidth of memory access always limit computation performance. While latency may be managed by architectural techniques, such as caching, bandwidth, which is the sustained flow rate of data, cannot be similarly managed.

Therefore, presenting a device integrating a logic IC and a memory IC in view of the various relevant considerations and technical barriers is a challenge in the industry.

SUMMARY OF THE INVENTION

One aspect of the present invention is to provide a novel structure and manufacturing process of a semiconductor device integrating control circuit and memory components in which a semiconductor portion comprising a control circuit may be stacked vertically with and electrically connected to another semiconductor portion comprising a plurality of memory components. The control circuit may be capable to access the memory components through transmission channels contributed by the electrical connection between the two semiconductor portions.

Another aspect of the present invention is to increase number of conductive contacts transmitting signals between the memory components and the control circuit to increase the bandwidth the semiconductor device may present.

Yet, another aspect of the present invention is to prevent from probing damage or defects created during testing, thinning or stacking processes when manufacturing a semiconductor device by testing the memory components through a control circuit which is in the second semiconductor portion without probing or testing machine involved. In another preferred embodiment, the control circuit may comprise a failure storage space storing an information in relation to perform repair process that a failed memory component is replaced.

According to an embodiment of the invention, a method to manufacture a semiconductor device may be provided. The method may comprise steps of: bonding a first wafer and a second wafer to be stacked vertically with one another, in which the first wafer provides a plurality of memory components and comprises a first substrate layer, a plurality of first interconnect conductive layers, a plurality of first conductive vias, and a plurality of first conductive contacts electrically connected to the first conductive vias, and the first conductive contacts in combination with the first conductive vias are formed on a top first interconnect conductive layer of the first interconnect conductive layers, and the second wafer provides a control circuit and comprises a second substrate layer and a plurality of second interconnect conductive layers; forming a plurality of input/output channels on a surface of one of the first and second wafers; and cutting the bonded first and second wafers into a plurality of dices. The first conductive contacts are electrically connected to the control circuit and the first conductive contacts in combinations with the first conductive vias form a plurality of transmission channels through which the control circuit is capable to access the memory components.

BRIEF DESCRIPTION OF THE DRAWINGS

Various objects and advantages of the present invention will be more readily understood from the following detailed description when read in conjunction with the appended drawing, in which:

FIGS. 14 and 15 show a sectional view of bonded wafers during manufacturing a semiconductor device, as shown in FIG. 13, according to a flow chart of an eighth embodiment of the present invention.

DESCRIPTION OF EMBODIMENTS OF THE INVENTION

For a more complete understanding of the present disclosure and its advantages, reference is now made to the following description taken in conjunction with the accompanying drawings, in which like reference numbers indicate like features. Persons of ordinary skill in the art having the benefit of the present disclosure will understand other variations for implementing embodiments within the scope of the present disclosure, including those specific examples described herein. The drawings are not limited to specific scale and similar reference numbers are used for representing similar elements. As used in the disclosures and the appended claims, the terms "example embodiment," "exemplary embodiment," and "present embodiment" do not necessarily refer to a single embodiment, although it may, and various example embodiments may be readily combined and interchanged, without departing from the scope or spirit of the present disclosure. Furthermore, the terminology as used herein is for the purpose of describing example embodiments only and is not intended to be a limitation of the disclosure. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any and all possible combinations of one or more of the associated listed items.

Figure 1:
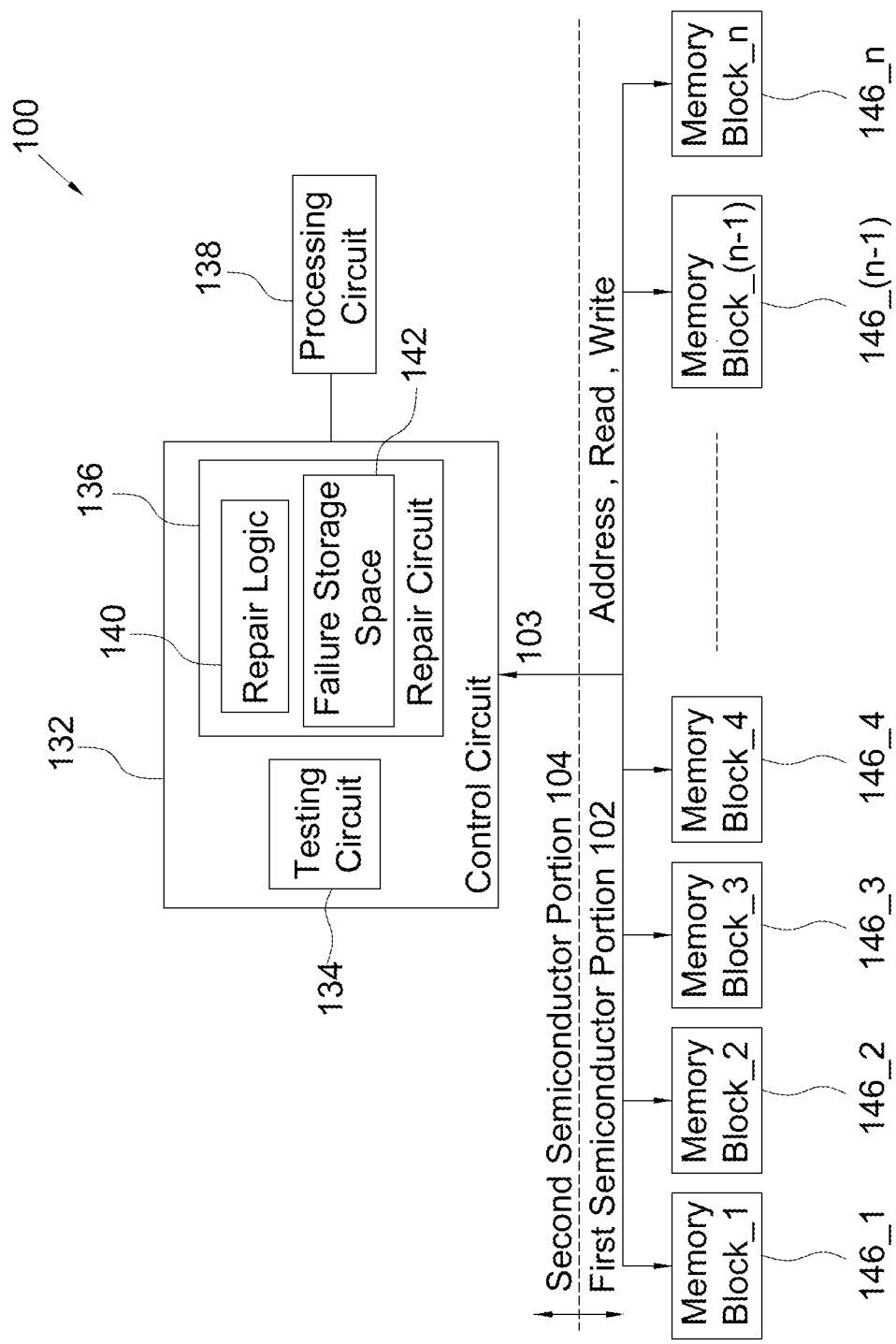
FIG. 1 shows an example block diagram of a semiconductor device according to a first embodiment of the present invention.

Please refer to FIG. 1 for an example block diagram of a semiconductor device according to a first embodiment of the present invention. A semiconductor device 100 may comprise a first semiconductor portion 102, a second semiconductor portion 104 stacked vertically on and electrically connected to the first semiconductor portion 102 and a plurality of transmission channels 103 for signal transmission between the first and second semiconductor portions 102, 104. Through the transmission channels 103, the control circuit in the second semiconductor portion 104 is capable to access the memory components in the first semiconductor portion 102 for data storage. The plurality of memory components (not shown) in the first semiconductor portion 102 are grouped into a plurality of memory blocks 146_1, 146_2, 146_3, 146_4 . . . 146_(n-1), 146_n. The memory components may be basic elements, such as memory cells to store/retain electrical information in the semiconductor device 100. The storage size of the memory blocks 146_1-146_n may be varied according to the requirements of a specific application in the design stage, for example, 64 Mb or 8 Mb. At least one of the memory components may be served as redundant spare to replace a failed memory component. Please note the structure, type, size, material, etc. of the memory components may be varied according to the requirements of a specific application. In the present embodiment, the memory components, each of which may be DRAM (Dynamic Random Access Memory) cell constructed by a capacitor and a transistor, may enable the logic component a storage space storing data. For example, when the capacitor of a memory component is charged, the data stored therein represents 1, and when the capacitor of a memory component is discharged, the data stored therein represents 0.

The second semiconductor portion 104 comprises a control circuit 132, comprising a testing circuit 134 and a repairing circuit 136, and/or a processing circuit 138. The processing circuit 138 may comprise a logic gate circuit, such as AND, OR, NOT, NAND, NOR, EXOR, EXNOR gates and the like, depending on the required application of the semiconductor device 100. The processing circuit 138 may be applied to construct but not limited to a SoC (System on Chip), Central Processing Unit (CPU), Graphics Processing Unit (GPU), Terminal Block Switch, neuro network artificial intelligence circuitry, etc. The control circuit 132 may access the plurality of memory blocks 146_1-146_n through the transmission channels 103 for data storage.

According to the embodiment, the testing circuit 134 is arranged to test the plurality of memory blocks 146_1-146_n in the second semiconductor portion 104 without probing or testing machine involved. Preferably, the testing circuit 134 may be arranged to simultaneously test the memory components of at least two of the memory blocks 146_1-146_n and repeat the test loop to test all of the memory blocks 146_1-146_n. The testing circuit 134, preferably implemented as a BIST (Built-in-self-test) logic, may generate address and data patterns to test the memory components. During the testing operation, data stored in the memory component corresponding to an address, sent by the testing circuit 134, may be read out for either comparison with expected data or self-comparison to detect an error. Errors are recorded. After the testing was done, the testing result including all errors, which may be implemented as address of failure bits, are read out to give the entire failure bit map (FBM) of the memory blocks 146_1-146_n. Then, the testing result may be translated with a repair algorithm to an information in relation to replace the failed memory components, such as repair mapping vectors, by the testing circuit 134.

More specifically, in one embodiment, the testing circuit 134 may comprise an error detection and compression unit and an error duplication unit. The testing circuit 134 may test at least one of the memory blocks (e.g. 146_1 in FIG. 1) for at least one time and use another at least one of the memory blocks 165 (e.g. 146_2 in FIG. 1) as failure capture memory (FCM) to store the testing result of the memory-block-under-test. Preferably, the other blocks which are not under test nor served as FCM may be free to perform other functions or operations. In another embodiment, the testing circuit 134 may test a group of the memory blocks simultaneously and use another group of the memory-block-as-FCM. Then, the groups may reverse role to cover all the memory blocks.

During the testing operation, an identical address may be sent to the memory-block-under-test and the memory-block-as-FCM by the testing circuit 134 at the same time to read the data stored in the memory component corresponding to the address in the memory-block-under-test. The data may be either compared with expected data or self-compared to detect an error, and then the testing circuit 134 may write the error to the memory component of the memory-block-as-FCM corresponding to the identical address when the testing result represents a failure. In other words, only errors may be written to the memory-block-as-FCM, and no data is written into memory-block-as-FCM if there is no error. In such a case, error capture is done without interrupting testing.

Two measurements may be applied to tolerate the impact from the scenario that some memory components of in the memory-block-as-FCM themselves are bad. One is duplication, and the other is data compression. For a given external address, data from multiple internal addresses or multiple 10 lines are checked together. Data from the bad memory components are compressed effectively into an error as the testing result by the error detection and compression unit of the testing circuit 134. Then, the error is duplicated by the error duplication unit of the testing circuit 134 to be written to the memory components of the identical locations in the memory-block-as-FCM. After the testing of the memory-block-under-test is done, errors are accumulated in the memory-block-as-FCM and the data stored in the memory-block-as-FCM may read out to give the entire failure bit map (FBM) of the memory-block-under-test. The FBM may contain all the failure locations and their addresses.

The repairing circuit 136 may comprise a repair logic 140 and a failure storage space 142. The information translated by the testing circuit 134 then may be stored in the failure storage space 142, which may be implemented as e-fuses, laser fuses or a non-volatile memory (NVM). Generally, the repair logic 140 may check repaired addresses stored in the failure storage space 142, and decide either (1) this location is not repaired, and therefore accessing the original memory address directly; or (2) this location is repaired, and therefore accessing the replacement address instead before read/write operation. Logically, the replacement may be implemented in several approaches. Preferably, the information may be a look-up table. When a memory access calls for an address, the address may be compared against the information by the repair logic 140. If there is a match, the address may correspond to a failed memory component. The repair logic 140 may re-direct the memory access to a different and known good memory component replacing the failed memory component.

Figure 2:
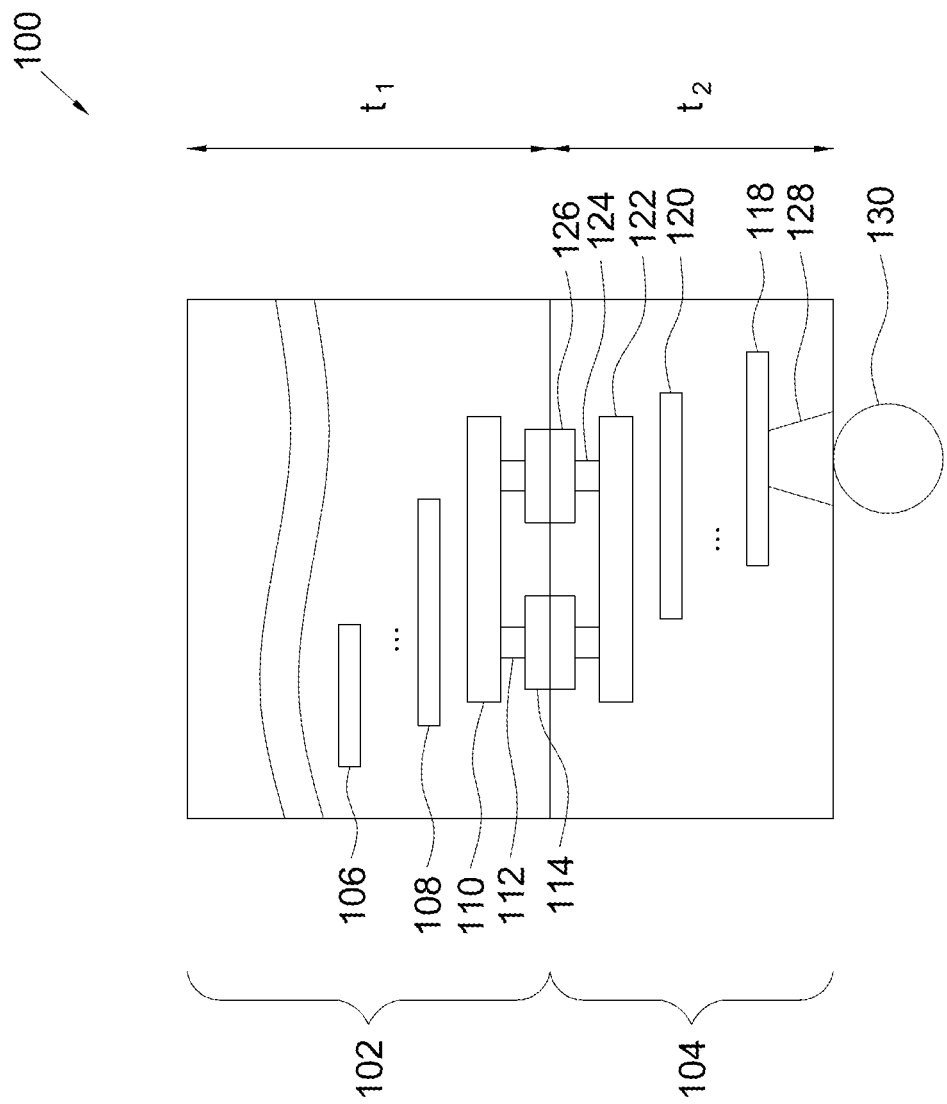
FIG. 2 shows a cross sectional view of an implementation of a semiconductor device, shown in FIG. 1, according to the first embodiment of the present invention.

Please refer to FIGS. 1 and 2, in which FIG. 2 shows a cross sectional view of an implementation of the semiconductor device 100, shown in FIG. 1, according to the first embodiment of the present invention. As mentioned above, the semiconductor device 100 comprises a first semiconductor portion 102 and a second semiconductor portion 104 stacked vertically on and electrically connected to the first semiconductor portion 102. The semiconductor device 100 further comprises a plurality of input/output channels, here comprising through silicon vias (TSV) 128 and metal bumps 130 for example. The position of the input/output channels may be varied, such as on a front surface of one of the first and second semiconductor portions 102, 104, or on a back surface of one of the first and second semiconductor portions 102, 104, etc. Here, the input/output channels are exemplarily on a back surface of the second semiconductor portion 104. According to the embodiment, each of the first and second semiconductor portions 102, 104 may be comprised of a substrate layer formed in a vicinity of the back surface and a plurality of interconnect conductive layers formed in a vicinity of the front surface, in which the substrate layer may be a silicon substrate arranged to form a plurality of active devices (e.g. transistors) and/or passive devices (e.g. capacitors), and the interconnect conductive layers, which may comprise a plurality of metal layers separated by a plurality of insulation layers, are arranged to form the connecting lines among the active devices and/or passive devices. A front-end-of-line (FEOL) may be formed in the substrate layer of the semiconductor portion, and a back-end-of-line (BEOL) may be formed in the interconnect conductive layers of the semiconductor portion.

A plurality of memory components (not shown in FIG. 2) are formed in the first semiconductor portion 102. A plurality of interconnect conductive layers 106, 108, 110, formed in a vicinity of the front surface of the first semiconductor portion 102 sequentially, may be the connecting lines of the plurality of memory components. Preferably, the memory components may be grouped into a plurality of memory blocks 146_1-146)n. The interconnect conductive layers 106, 108, 110, for example, may be made from but not limited to conductive material and patterned with integrated circuit processes, and the number and shape of interconnect conductive layers 106, 108, 110 may be varied. Through the conductive vias 112, a plurality of conductive contacts 114 electrically connected to the top interconnect conductive layer 110, as well as the memory component, are formed and exposed at the front surface of the first semiconductor portion 102.

The control circuit 132 may be formed in a vicinity of the front surface of the second semiconductor portion 104 which contacts with the front surface of the first semiconductor portion 102. Specifically, the control circuit 132 is constructed by a plurality of interconnect conductive layers 118, 120, 122, formed sequentially. The interconnect conductive layers 118, 120, 122, for example, may be made from but not limited to conductive material and patterned with integrated circuit processes, and the number and shape of the interconnect conductive layers 118, 120, 122 may be varied according to the desired control circuit 132. Through the conductive vias 124, a plurality of conductive contacts 126 electrically connected to the top interconnect conductive layer 122, as well as the control circuit 132, are formed and exposed at the front surface of the second semiconductor portion 104 which is substantially of same sizes and shape as those of the front surface of the first semiconductor portion 102.

The transmission channels formed by the electrically connection between the conductive contacts 114, 126, may be formed with hybrid bonding technology. Bonding surfaces of the conductive contacts 114, 126, consisting of small metal pads and dielectric, are planarized and then bonded to form the physical joint between the first and second semiconductor portions 102, 104 for signal transmission therebetween. The number and shape of conductive contacts 114, 126 may be varied. Preferably, the position and number of the conductive contacts 126 may correspond to those of the conductive contacts 114, and more preferably, the number of the conductive contacts 126 may be identical to that of the conductive contacts 114. The conductive contacts 114, 126 may provide enough input/output signal channels for common 8-bit interface for command/address and data, differential clock and differential DQ strobe (DQS) for high speed double data-rate (DDR), DM for data masking, CE for chip select, etc. More preferably, the conductive contacts 114, 126 may provide double physical input/output signal channels for those signals to increase the yield rate of the semiconductor device 100.

The conductive contacts 114, 126 may be made from conductive substance, and preferably metal, alloy or the like in about less than 10 μm thick, and preferably, about 1-3 μm thick. The conductive contacts 114, 126 may be substantially of the same thickness as that of the conductive vias 112, 124. Therefore, the uniformity of the top interconnect conductive layers 110, 122 are essential to provide a flat base to form the conductive contacts 114, 126. The conductive contacts 114, 126 may act as signal/power channels for signal transmission and power supply between the first and second semiconductor portions 102, 104 or as dummy pads for structural integrity. The conductive contacts 114, 126 electrically connect to the control circuit 132 and the memory components, and therefore through the conductive contacts 114, 126, the control circuit 132 may access or read/write the memory components. A top surface of the conductive contacts 114, 126 and a top surface of the top interconnect conductive layers 110, 122 may be microscopically flat without probing damage to promote bonding reliability, because probing the top interconnect conductive layers 110, 122 will impact the bonding of the conductive contacts 114, 126. In such a case, the bonding pitch of the conductive contacts 114, 126 may be very fine, such as less than 10 µm, preferably less than 3-10 µm, and more preferably less than 1-3 µm. The pitch may be the distance measured from the center of one conductive contact 114, 126 to the center of an adjacent conductive contact 114, 126. Therefore, preferably, each signal may be transmitted through at least two physical connections, each offered by the electrically connection of a pair of the conductive contact 114, 126. The maximum number of conductive contact 114, 126 may be increased, and therefore a great potential for the bandwidth may be carried out. The upper limit of the number may be increased up to the square of the quotient of a chip width of the semiconductor device 100 or the second semiconductor portion 104 and a finest pitch of the conductive contact 114, 126 between the first and the second semiconductor portions 102, 104. Preferably, the bandwidth may be increased up to a thousand times but the power reduced to a fraction of those of a traditional HBM (High Bandwidth Memory). Specifically, in some embodiments, a bandwidth density ratio of 2 GBps/64 Mb or 32 GBps/1 Gb or greater may be presented. Moreover, by using at least two physical connections (i.e. a pair of conductive contacts 114, 126) to transmit one signal between the first and second semiconductor portions 102, 104, the yield rate of the semiconductor device 100 may also be increased.

The input/output channels may be conductive materials to transmit signals in and from or supply power to the semiconductor device 100, and therefore external signals may be input into the semiconductor device 1 and result calculated by the control circuit 132 may be output to an external device, such as a Printed Circuit Board (PCB).

According to the present embodiment, the thicknesses of the first semiconductor portion 102 and the second semiconductor portion 104 may be different. A thickness $t_1$ of the first semiconductor portion 102 is the length measured from the front surface to the back surface of the first semiconductor portion 102, and similarly, a thickness $t_2$ of the second semiconductor portion 104 is the length measured from the front surface to the back surface of second semiconductor portion 104. In other words, one of the first and second semiconductor portions 102, 104 may be thinner than the other one of the first and second semiconductor portions 102, 104, and here, the second semiconductor portion 104 may be thinner than the first semiconductor portion 102. Moreover, the first and second semiconductor portions 102, 104 may be substantially of same sizes and shape viewing to the top of the semiconductor device 100. In other words, the first and second semiconductor portions 102, 104 may be substantially overlapped with each other viewing to the top of the semiconductor device 100.

Figure 3:
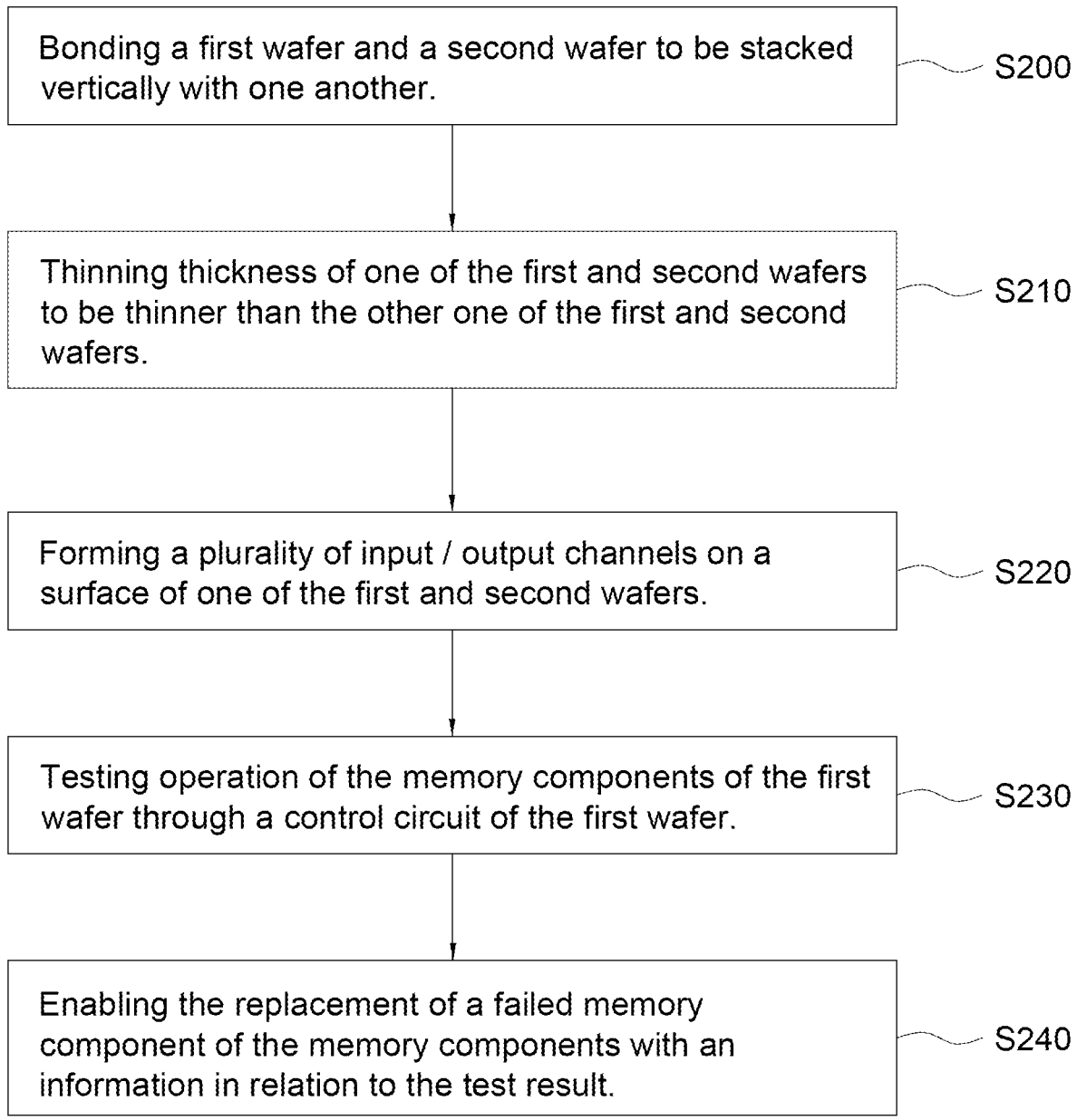
FIG. 3 shows a flow chart of a method to manufacture a semiconductor device according to a second embodiment of the present invention.
Figure 4:
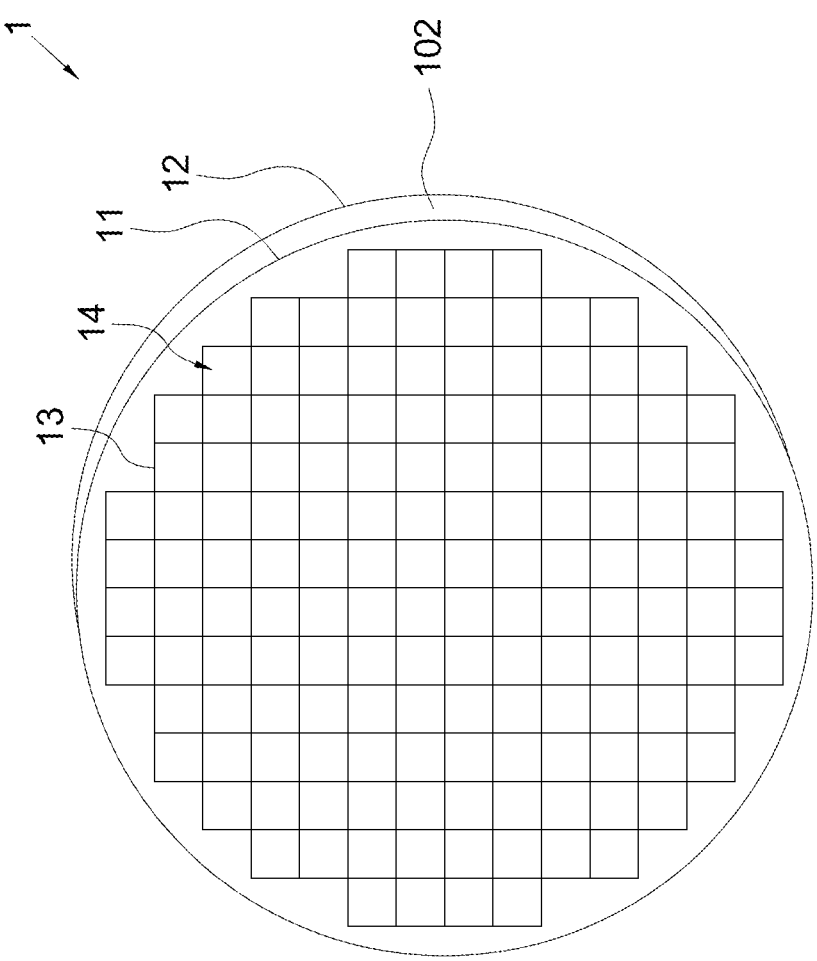
FIG. 4 shows a perspective view of a first wafer according to the second embodiment of the present invention.

Please refer to FIG. 3 for a flow chart of a method to manufacture a semiconductor device according to a second embodiment of the present invention. The method may be applied to but not limited to manufacture the semiconductor device 100 shown in FIG. 2. Taking the semiconductor device 100 shown in FIG. 2 for example, in step S200, a first wafer and a second wafer may be bonded to be stacked vertically with one another. Please also refer to FIG. 4, which shows a perspective view of a first wafer 1 according to the second embodiment of the present invention. The first wafer 1 may comprise a first semiconductor portion 102 in the form of wafer. The first wafer 1, for example made from silicon, glass or the like, may present a front surface 11 and a back surface 12, which are also the front surface and back surface of the first semiconductor portion 102. A plurality of memory components are formed in a vicinity of the front surface of the first wafer 1 within each repetitive region 14. The repetitive regions 14 may be divided by a plurality of scribe lines 13. The number of the repetitive regions 14 and scribe lines 13 may be varied. After the first wafer 1 is cut into dices, each repetitive region 14 corresponds to a die, which is the first semiconductor portion 102 in the form of die. Appearance of the second wafer (not shown) comprising a second semiconductor portion 104 may be similar to the first wafer 1, but a processing circuit and a control circuit which comprises a testing circuit and/or a repairing circuit are formed in each repetitive region of the second wafer instead. The first and second wafers 1 may be planarized to achieve required flatness. Preferably, the shape and size of the repetitive regions 14 defined by the scribe lines 13 on the first wafer 1 may be substantially the same as those of the repetitive regions defined by the scribe lines on the second wafer. Then, the first and second wafers 1 may be bonded to each other with annealing at a temperature which is less than 400 □ for about 0.5 to 4 hours. Preferably, the bonding may be performed with wafer-to-wafer bonding technology to simplify the assembly process, such as front-to-front stacking wafer-to-wafer bonding, front-to-back stacking wafer-to-wafer bonding, etc.

Figure 5:
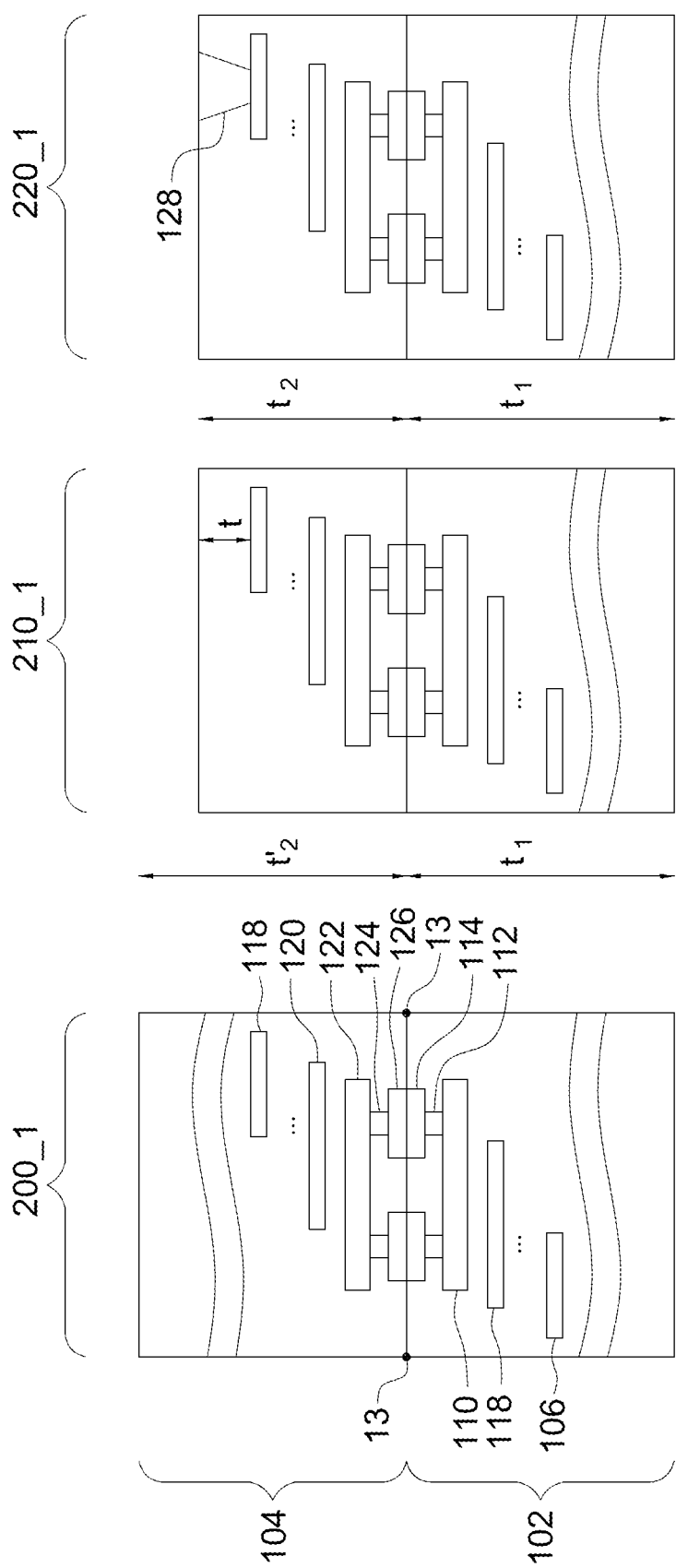
FIG. 5 shows a sectional view of bonded first and second wafers during manufacturing a semiconductor device, as shown in FIG. 2, according to the second embodiment of the present invention.

Please also refer to FIG. 5 for a sectional view of bonded first and second wafers during manufacturing the semiconductor device 100, as shown in FIG. 2, according to the second embodiment of the present invention. Preferably, a wafer-to-wafer bonding process may be performed, so that the first and second semiconductor portions 102, 104 may be substantially of the same sizes and shape. The semiconductor device 100 may be manufactured by two wafers, a first wafer and a second wafer, which may be similar to the wafer shown in FIG. 4. The first wafer may comprise a first semiconductor portion 102, and the second wafer may comprise a second semiconductor portion 104. Here, referring to 200_1, a front-to-front stacking wafer-to-wafer bonding to stack the first and second wafers vertically is performed for example. This means the front surface 11 of the first wafer 1 faces to the front surface of the second wafer. In the bonded first and second wafers 1, the conductive contacts 114 exposed at the front surface 11 of the first wafer 1 may be electrically connected to the conductive contacts 126 exposed at the front surface of the second wafer, and the scribe lines 13 on the front surface 11 of the first and second wafers 1 may be fully overlapped with each other. Preferably, a repetitive region on the second wafer along with a repetitive region on the first wafer right adjacent to the repetitive region on the second wafer are predetermined for manufacturing the semiconductor device 100.

In addition to wafer-on-wafer bonding, in some embodiments of the present invention, a chip-on-wafer bonding may be performed alternately. In such a case, one of the first, second wafers may be cut into chips before bonding. First, the first wafer may be diced into several memory chips. Then, the memory chips are mounted onto the second wafer individually through the chip-on-wafer bonding process. In some embodiments, the entire repairing circuit or the failure storage space may be formed in the first semiconductor portion. Further, in some embodiments, step S200 may be implemented as steps comprising the step in which the first wafer and the second wafer may be bonded to be stacked vertically with one another and two steps in one of which a third wafer may be bounded to be stacked vertically with one of the first and second wafers and in another one of which another first wafer may be bounded to be stacked vertically with the first wafer, respectively performed. The detailed variations are described in the following paragraphs.

Then, in Step S210, the thickness of one of the first and second wafers 1 may be thinned to be thinner than the other one of the first and second wafers 1. As shown in 210-1 of FIG. 5, in the present embodiment, the thickness of the second wafer may be reduced from $t'_2$ to $t_2$, thinner than the thickness of the first wafer 1, $t_1$, with chemical mechanical planarization (CMP) process or etched with dry or wet etching. Preferably, when the polishing is done, the thickness t above the bottommost interconnect conductive layer 118 of the second semiconductor portion 104 may be within 10 µm. In some embodiments, step S210 may be performed repeatedly to thin the thickness of another first or second wafer. The detailed variations are described in the following paragraphs.

Then, in Step S220, a plurality of input/output channels may be formed on a surface of one of the first and second wafers 1. As shown in 220-1 of FIG. 5, TSV 128 of the input/output channels are formed through the back surface of the second wafer to be electrically connecting to the bottommost interconnect conductive layer 118. Then, after the metal bumps 130, electrically connecting to with the TSV 128, are formed, the bonded first and second wafers 1 may be diced into several semiconductor devices 100, as shown in FIG. 1.

Then, in Step S230, operation of the memory components is tested through the control circuit of the second wafer. The details in structure, function and operation of the testing may be as mentioned above with respect to FIG. 1. Briefly speaking, during the testing, the testing circuit of the control circuit may read the data in one of the memory components corresponding to an address, and then record an error when the testing result represents a failure, such as the read data mismatches a predetermined data.

Then, in Step S240, after the testing of the memory components through the testing circuit, replacement of a failed memory component of the memory components may be enabled with an information in relation to the testing result. As mentioned above, the repairing may be performed by the repairing circuit and the information may be repaired address stored in the failure storage space of the repairing circuit. The details in structure, function and operation of the repairing may be as mentioned above.

In the present embodiment, then, the bonded first and second wafers 100 may be cut along the overlapped scribe lines 13 into a plurality of semiconductor devices 100 in a form of dices, as shown in FIG. 2. Because the repetitive regions 14 defined by the scribe lines 13 are substantially of same sizes and shape, the first and second semiconductor portions 102, 104 of the semiconductor devices 100 are substantially of same sizes and shape viewing to the top of the semiconductor device 100. Each of the dices may be packaged in an integrated circuit package.

Figure 6:
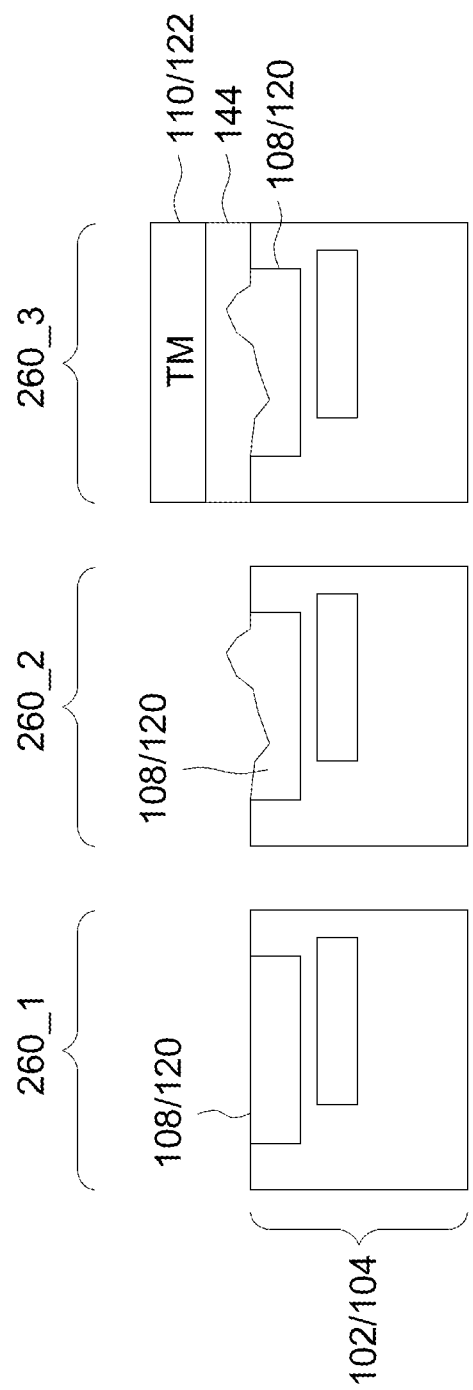
FIG. 6 shows a sectional view of one of the first and second wafers during manufacturing a semiconductor device according to a third embodiment of the present invention.
Figure 7:
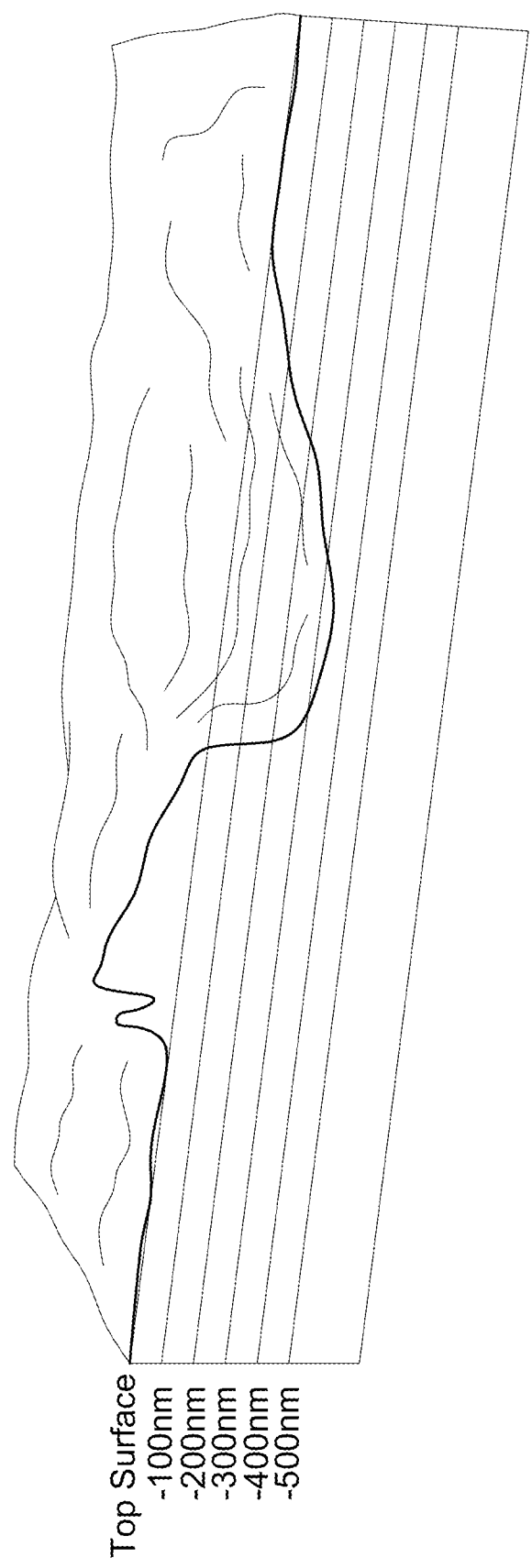
FIG. 7 shows a sectional view of an interconnect conductive layer with probe mark.

In some embodiments, the testing of the memory components may be performed in different timing and may be split into several stages of testing process. For example, the testing may be performed at one or more timings including before the formation of the TSV, after the formation of the TSV but before cutting the bonded first and second wafers into dices, after cutting the bonded first and second wafers into dices, etc. Specifically, in some embodiments, an additional inline testing may be performed during the manufacturing of the semiconductor device 100. Please refer to FIG. 6, which shows a sectional view of one of the first and second wafers during manufacturing the semiconductor device 100 according to a third embodiment of the present invention. When the interconnect conductive layer 108/120, which is the first one below (i.e. the second highest interconnect conductive layer) the predetermined top interconnect conductive layer 110/122, is formed in the first or second semiconductor portions 102/104, i.e. 260_1, the inline testing, for example comprising testing for basic operation of the memory/logic component, electrical character, etc., may be performed through probing the interconnect conductive layer 108/120 with a probing machine. The probe mark caused by the probing machine, i.e. 260_2, may damage the flatness of a top surface of the interconnect conductive layer 108/120, as shown in FIG. 7. The probe mark unevenness can be as much as 1 µm, i.e. not less than 0.1 µm. However, after forming an insulation layer 144, the top interconnect conductive layer 110/122 may be formed with a microscopic flat top surface, i.e. 260_3. A flatness of the microscopic flat top surface of the top interconnect conductive layer 110/122 may be less than 0.1 µm for example, to support a good bonding of the conductive contacts 114, 126, as shown in FIG. 2.

Figure 8:
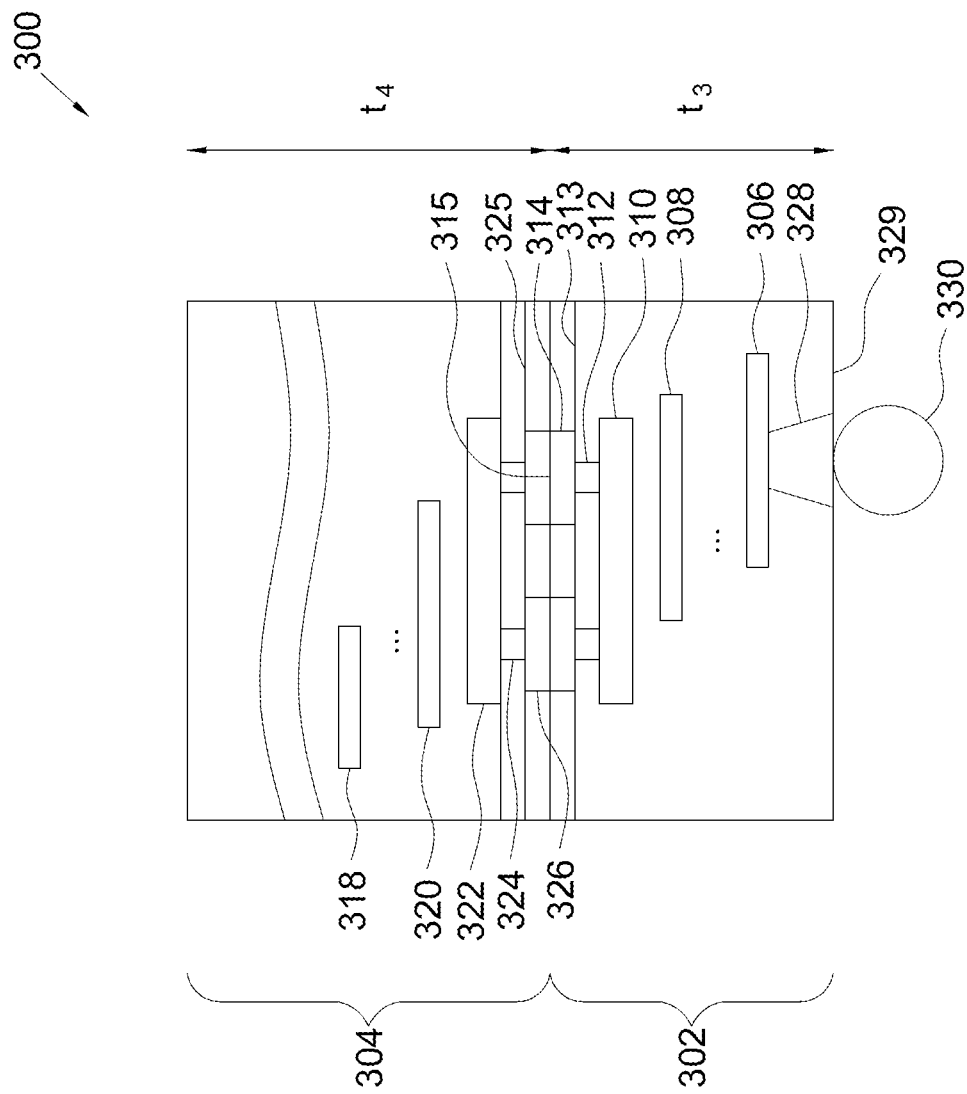
FIG. 8 shows a cross sectional view of a semiconductor device according to a fourth embodiment of the present invention.

Please refer to FIG. 8 which is a cross sectional view of a semiconductor device 300 according to a fourth embodiment of the present invention. The semiconductor device 300 comprises a first semiconductor portion 302 and a second semiconductor portion 304 stacked vertically with and electrically connected to the first semiconductor portion 302. A plurality of memory components, the connecting lines of which may be constructed by a plurality of interconnect conductive layers 306, 308, 310, are formed in the first semiconductor portion 302, a control circuit, arranged to test and access the memory components, and/or a processing circuit, both of which may be constructed by a plurality of interconnect conductive layers 318, 320, 322 as mentioned in the above paragraphs are formed in the second semiconductor portion 304. As mentioned above, the second highest or second-to-top interconnect conductive layer 308/322, i.e. the first interconnect conductive layer below the top interconnect conductive layer 310/322 may be inline-tested during the manufacturing process. According to the embodiment, the first semiconductor portion 302 is arranged to comprise a plurality of conductive vias 312 and a plurality of conductive contacts 314 electrically connected to at least one interconnect conductive layer (e.g. a top interconnect conductive layer) 310 in the first semiconductor portion 302. The top surface of conductive contacts 312 are on the same level with the top surface (i.e. 313) of the insulation layer of the first semiconductor portion 302. The second semiconductor portion 304 is arranged to comprise a plurality of conductive vias 324 and a plurality of conductive contacts 326 electrically connected to at least one interconnect conductive layer (e.g. a top interconnect conductive layer) 322 in the second semiconductor portion 304. The top surface of conductive contacts 312 are on the same level with the top surface (i.e. 313) of the insulation layer of the second semiconductor portion 304. Moreover, the conductive contacts 314 are attached to the conductive contacts 326 on the interface (i.e. 315) between the first semiconductor portion 302 and the second semiconductor portion 304. Moreover, the first semiconductor portion 302 further comprises at least one TSV 328 formed through a back surface 329 of the second wafer, in which one end of the TSV 328 is electrically connected to an interconnect conductive layer (e.g. a first interconnect conductive layer 306) of the first semiconductor portion 302, and the other end of the TSV 328 has a surface with the same level with the back surface 329 of the second wafer. The TSV 328 is used as an input/output channel to transmit signals in and from or supply power to the semiconductor device 300. According to the embodiment, the thickness $t_3$ of the first semiconductor portion 302 is smaller than the thickness $t_4$ of the second semiconductor portion 304.

Figure 9A:
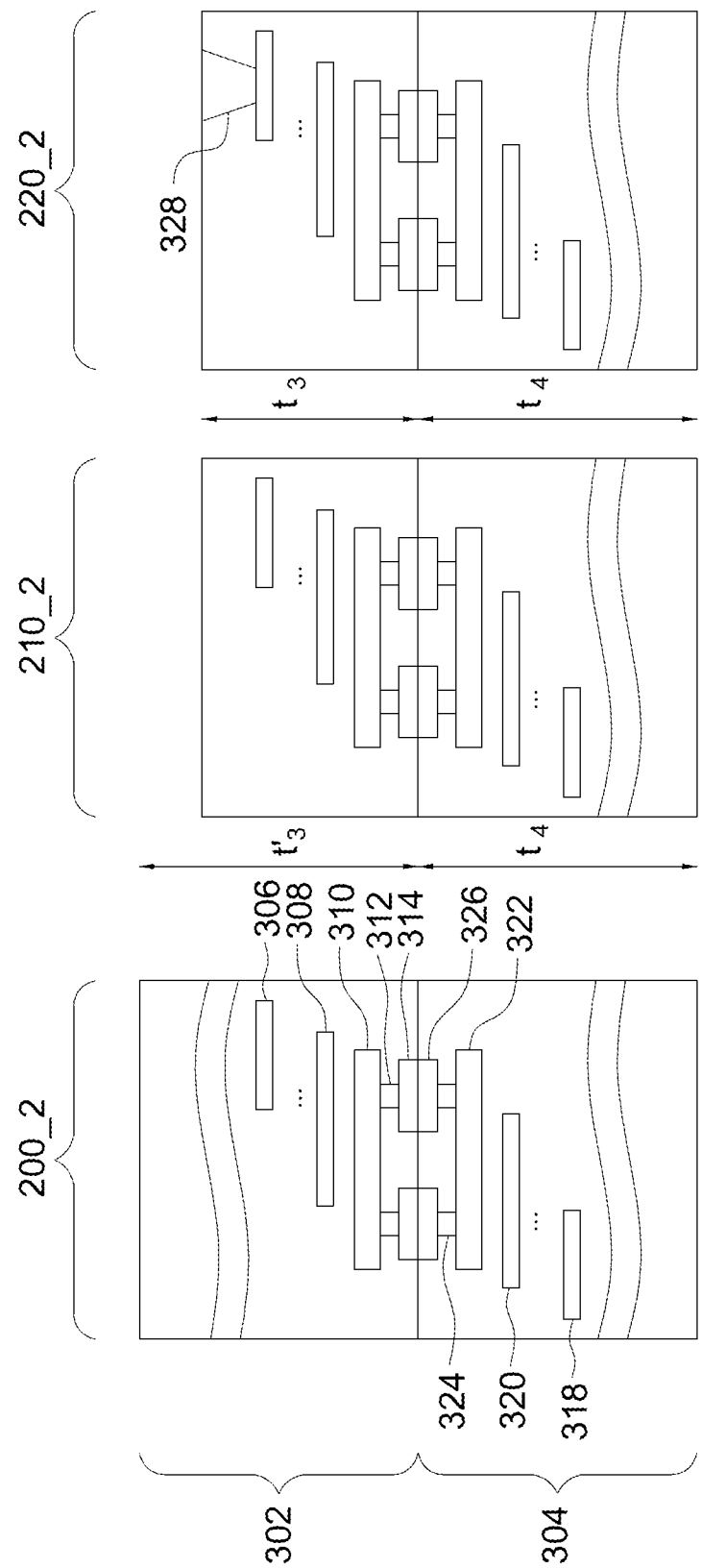
FIG. 9A shows a sectional view of bonded wafers during manufacturing a semiconductor device, as shown in FIG. 8, according to the flow chart shown in FIG. 3 of the second embodiment of the present invention.

Please refer to FIG. 9A, which shows a sectional view of bonded wafers during manufacturing the semiconductor device 300, as shown in FIG. 8, according to the flow chart shown in FIG. 3 of the second embodiment of the present invention. The semiconductor device 300 may be manufactured by two wafers, a first wafer and a second wafer, which may be similar to the wafer shown in FIG. 4. The first wafer may comprise a second semiconductor portion 304, and the second wafer may comprise a first semiconductor portion 302. Then, in Step S200, a front-to-front stacking wafer-to-wafer bonding may be performed so that the second wafer may be stacked vertically with and electrically connected to the first wafer, i.e. 200_2 in FIG. 9A. This means a front surface of the first wafer faces to a front surface of the second wafer, and the conductive contacts 314 are electrically connected to the conductive contacts 326 to form transmission channels to transmit signals between the first and second semiconductor portions 302, 304. The scribe lines of the first and second wafers may be overlapped. Then, in Step S210, the second wafer is then thinned from the thickness $t'_3$ to the thickness $t_3$, which is thinner than the thickness $t_4$ of the first wafer, i.e. 210_2 in FIG. 9A. Then, in Step S220, a plurality of input/output channels, here comprising TSV 328 and/or metal bumps (not shown) for example, are formed through the back surface of the second wafer, i.e. 220_2 in FIG. 9A. Afterwards, in Steps S230 and S240, testing and repairing for the memory components of the second semiconductor portion may be performed by the control circuit of the first semiconductor portion, as mentioned above.

Figure 9B:
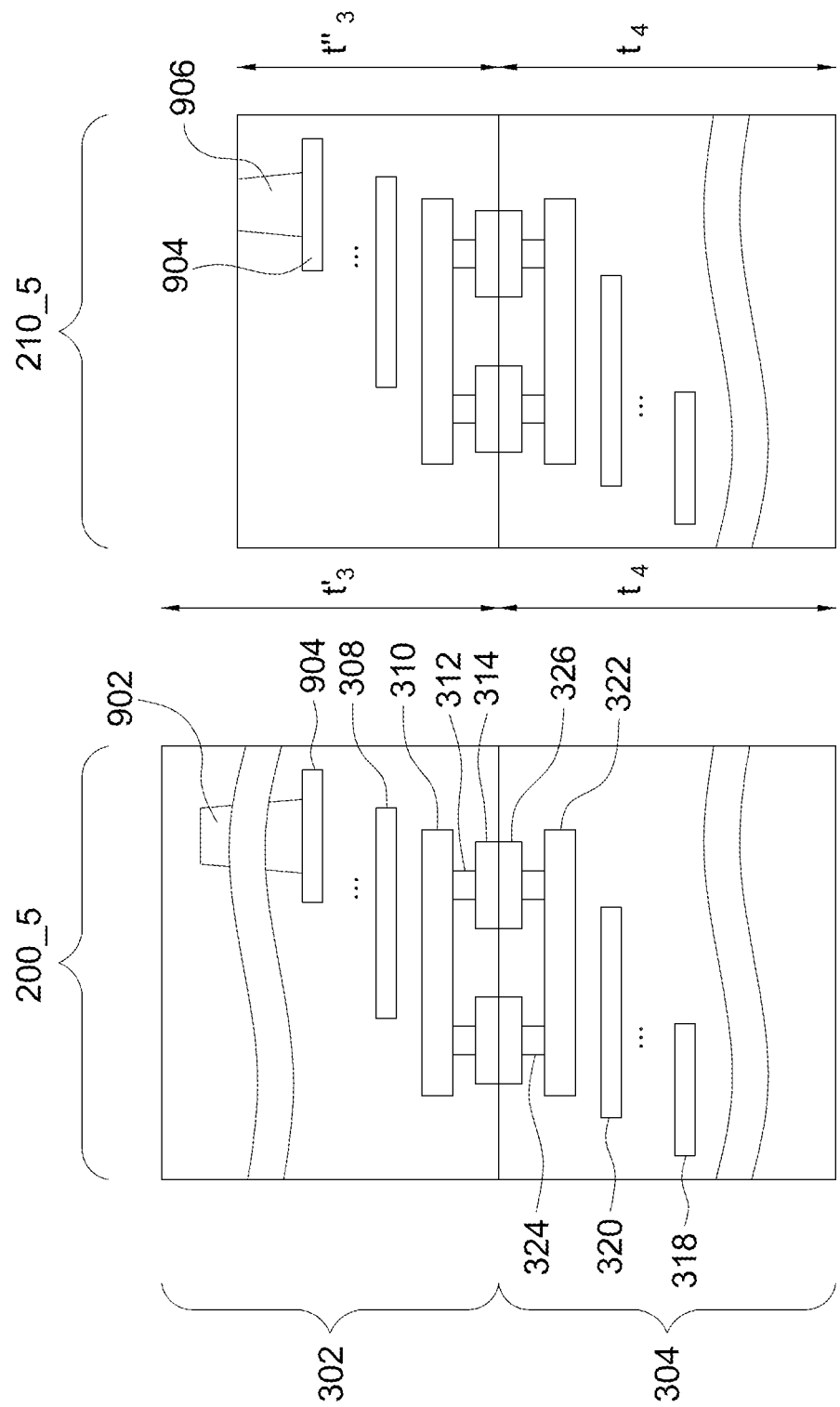
FIG. 9B shows a sectional view of bonded wafers during manufacturing a semiconductor device, as shown in FIG. 8, according to another embodiment of the present invention.

Please refer to FIG. 9B, which shows a sectional view of bonded wafers during manufacturing the semiconductor device 300, as shown in FIG. 8, according to another embodiment of the present invention. The semiconductor device 300 may be manufactured by two wafers, a first wafer and a second wafer, which may be similar to the wafer shown in FIG. 4. The first wafer may comprise a second semiconductor portion 304, and the second wafer may comprise a first semiconductor portion 302. In comparison to the manufacturing process as shown in FIG. 9A, in this embodiment as shown in FIG. 9B, a plurality of built-in TSVs is formed in the second wafer (e.g. 902 in first semiconductor portion 302). In this example, the built-in TSV 902 is a via-middle TSV, in which one end of the built-in TSV 902 is electrically connected to the bottommost interconnect conductive layer 904 of the second wafer and the other end of the built-in TSV 902 is located inside the substrate layer of the second wafer. In other words, the built-in TSV 902 is formed closer the back surface than the front surface of the second wafer. It is noted that, in another embodiments of the present invention, the built-in TSV(s) 902 may also be a via-first TSV, a via-last TSV, and/or a combination of the via-middle TSV, the via-first TSV, and the via-last TSV.

Then, in Step S200, a front-to-front stacking wafer-to-wafer bonding may be performed so that the second wafer may be stacked vertically with and electrically connected to the first wafer, i.e. 200_5 in FIG. 9B. This means a front surface of the first wafer faces to a front surface of the second wafer, and the conductive contacts 314 are electrically connected to the conductive contacts 326 to form transmission channels to transmit signals between the first and second semiconductor portions 302, 304. The scribe lines of the first and second wafers may be overlapped. Then, in Step S210, the second wafer is thinned from the thickness $t'_3$ to the thickness $t''_3$ to expose the first end of the built-in TSV 902, in which the thickness $t''_3$ is thinner than the thickness $t_4$ of the first wafer, i.e. 210_5 in FIG. 9B. As a result, a plurality of input/output channels, here comprising TSV 906 and/or metal bumps (not shown) for example, are formed in the back surface of the second wafer, i.e. 210_5 in FIG. 9B. In other words, the Step S220 may be omitted in this embodiment. Afterwards, in Steps S230 and S240, testing and repairing for the memory components of the second semiconductor portion may be performed by the control circuit of the first semiconductor portion, as mentioned above.

In addition, in the embodiment as shown in FIG. 9A, to form the TSV 328 in the back surface of the second wafer, the second wafer should be thinned until the thickness between the bottommost interconnect conductive layer 306 and the back surface of the second wafer is less than 10 μm. However, in the embodiment as shown in FIG. 9B, as the TSV 902 is a built-in TSV in the second wafer, the thinning process is only to expose the TSV 902 to form the TSV 906. Therefore, the thickness between the bottommost interconnect conductive layer 904 and the back surface of the second wafer may greater than 10 μm. For example, the thickness may be in the range from 35 μm to 50 μm.

Figure 10:
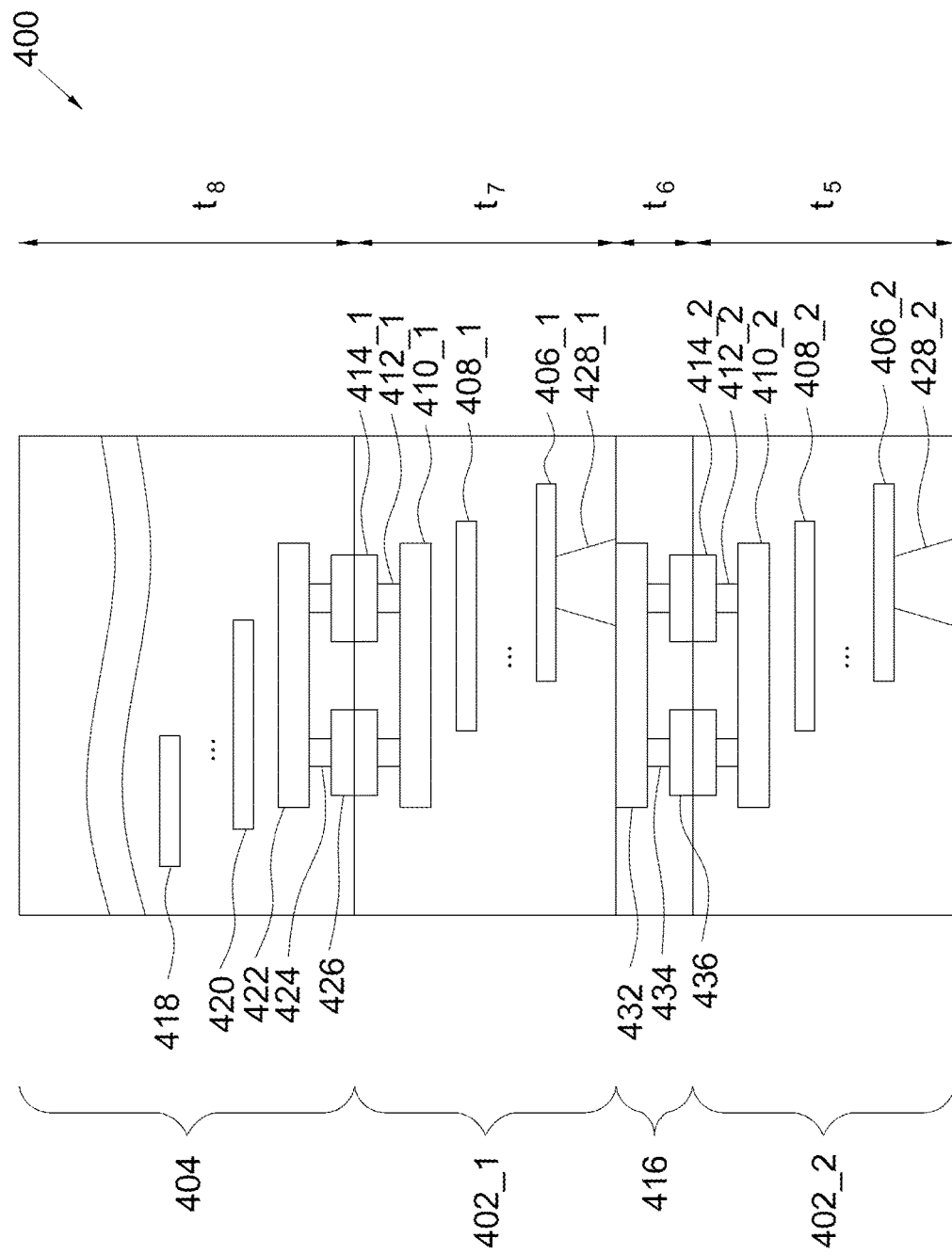
FIG. 10 shows a cross sectional view of a semiconductor device according to a fifth embodiment of the present invention.

FIG. 10 is a cross sectional view of a semiconductor device 400 according to a fifth embodiment of the present invention. The semiconductor device 400 comprises two first semiconductor portions 402_1, 402_2, a second semiconductor portion 404, and a third semiconductor portion 416. According to the embodiment, the two first semiconductor portions 402_1, 402_2 and the second semiconductor portion 404 are similar to the first semiconductor portion 102 and the second semiconductor portion 104 of FIG. 2 respectively, thus the detailed description is omitted here for brevity. The second semiconductor portion 404, the first semiconductor portion 402_1, the third semiconductor portion 416, and the first semiconductor portion 402_2 are stacked vertically and sequentially. Therefore, the third semiconductor portion 416 is stacked vertically between and electrically connected to the two first semiconductor portions 402_1, 402_2. A plurality of memory components, the connecting lines of which may be constructed by a plurality of interconnect conductive layers 406_1, 408_1, 410_1 or 406_2, 408_2, 410_2, are formed in each of the first semiconductor portion 402_1, 402_2, a control circuit, arranged to test and access the memory components, and/or a processing circuit, both of which may be constructed by a plurality of interconnect conductive layers 418, 420, 422, as mentioned in the above paragraphs are formed in the second semiconductor portion 404, and a plurality of conductive contacts 432, 436 electrically connected with a plurality of conductive vias 434 are formed on front and back surfaces of the third wafer. According to the embodiment, the first semiconductor portions 402_1, 402_2 are arranged to comprise a plurality of conductive vias 412_1, 412_2 and a plurality of conductive contacts 414_1, 414_2 electrically connected to the top interconnect conductive layers 410_1, 410_2. The second semiconductor portion 404 is arranged to comprise a plurality of conductive vias 424 and a plurality of conductive contacts 426 electrically connected to the top interconnect conductive layer 422. The conductive contacts 414_1 are attached to the conductive contacts 426 on the interface between the first semiconductor portion 402_1 and the second semiconductor portion 404. The third semiconductor portion 416 is arranged to be an interconnecting structure for electrically connecting the two first semiconductor portions 402_1, 402_2. Moreover, the first semiconductor portion 402_1/402_2 further comprises at least one TSV 428_1/428_2 formed through a back surface of the second and fourth wafers, in which one end of the TSV 428_1/428_2 is electrically connected to the first interconnect conductive layer 406_1/406_2, and the other end of the TSV 428_1/428_2 has a surface with the same level with the back surface of the second and fourth wafers. The TSVs 428_1, 428_2 are used as input/output channels to transmit signals in and from or supply power to the semiconductor device 400. According to the embodiment, the thickness $t_7$ or $t_5$ of the first semiconductor portion 402_1/402_2 is smaller than the thickness $t_8$ of the second semiconductor portion 404.

Figure 11:
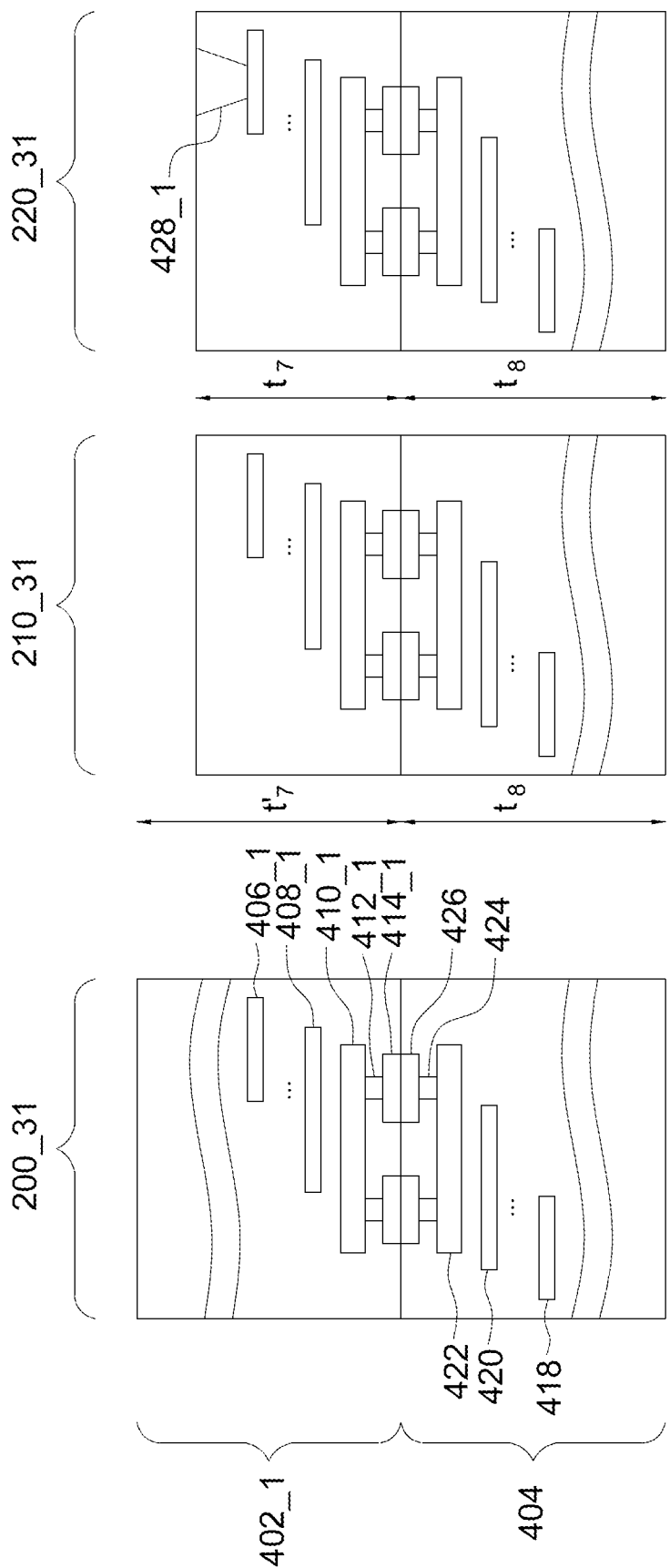
FIGS. 11 and 12 show a sectional view of bonded wafers during manufacturing a semiconductor device, as shown in FIG. 10, according to a flow chart of a sixth embodiment of the present invention.
Figure 12:
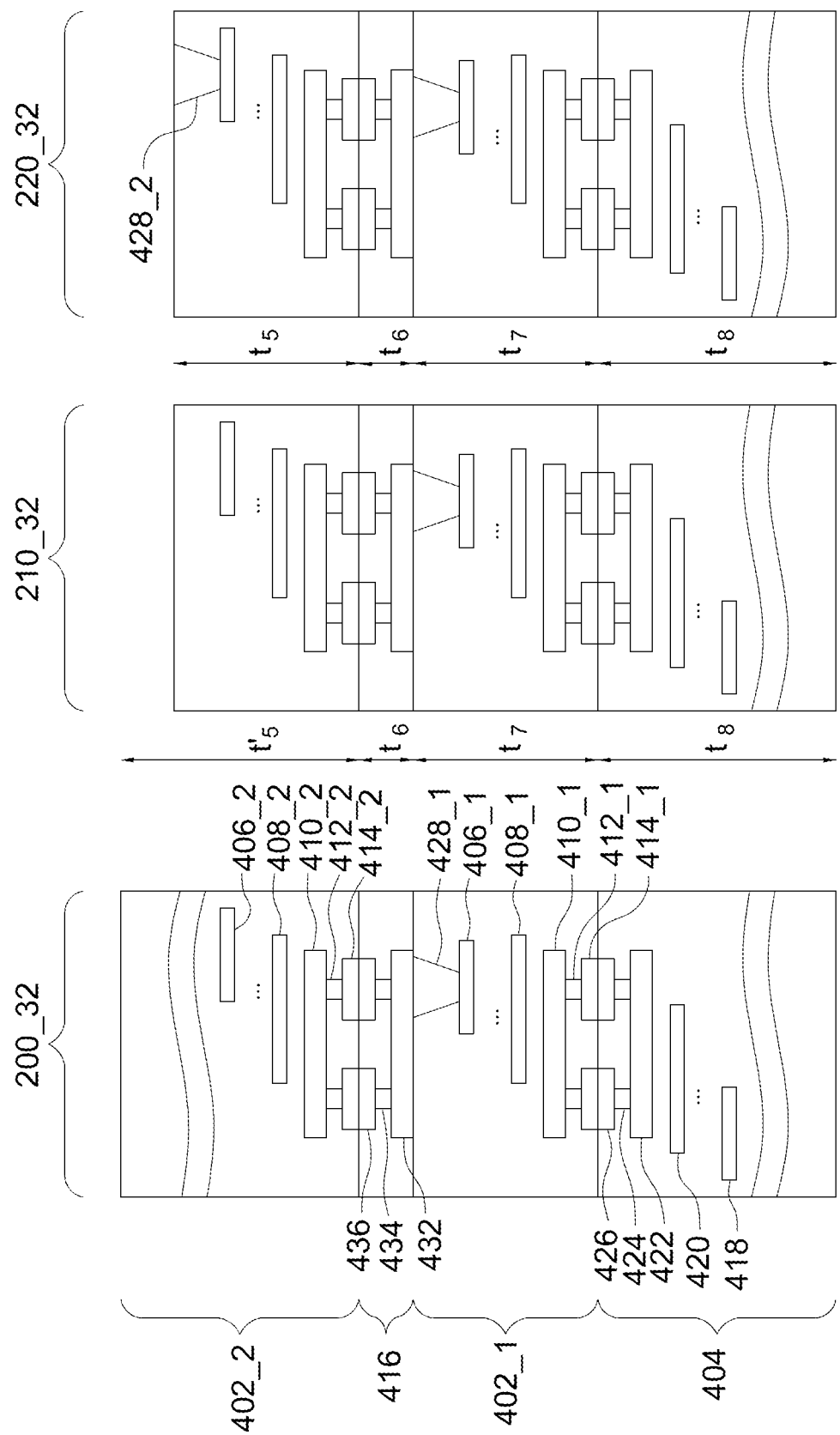

Please refer to FIGS. 11 and 12, which show a sectional view of bonded wafers during manufacturing the semiconductor device 400, as shown in FIG. 10, according to a flow chart of a sixth embodiment of the present invention. The semiconductor device 400 may be manufactured by three wafers, two first wafers, and a second wafer, which may be similar to the wafer shown in FIG. 4. The first wafers may comprise the first semiconductor portion 402_1, 402_2, and the second wafer may comprise the second semiconductor portion 404. Then, a front-to-front stacking wafer-to-wafer bonding may be performed so that one the first wafers may be stacked vertically with the second wafer and the conductive contacts 414_1 may be electrically connected to the conductive contacts 426 to form transmission channels to transmit signals between the first and second semiconductor portions 402_1, 404, i.e. 200_31 in FIG. 11. The first wafer is then thinned from the thickness $t'_7$ to the thickness $t_7$, which is thinner than the thickness $t_8$ of the second wafer, i.e. 210_31 in FIG. 11. Then, a plurality of input/output channels, here comprising TSV 428_1 for example, are formed on a back surface of the first wafer, i.e. 220_31 in FIG. 11. Then, a hybrid bonding layer (i.e. 416) is formed on the back surface of the first semiconductor portion 402_1. Then, another front-to-back stacking wafer-to-wafer bonding may be performed, so that the other first wafer (i.e. 402_2) may be stacked vertically with the hybrid bonding layer (i.e. 416), i.e. 200_32 in FIG. 12. The conductive contacts 414_2 may be electrically connected to the conductive contacts 426 to enable the transmission channels to transmit signals between the first, second and third semiconductor portions 402_1, 404, 416, 402_2. Then, the second one of the first wafers may be then thinned from the thickness $t'_5$ to the thickness $t_5$, which is thinner than the thickness $t_8$ of the second wafer, i.e. 210_32 in FIG. 12. A plurality of input/output channels, here comprising TSV 250 and metal bumps (not shown) for example, electrically connected to a back surface of the second one of the first wafers, i.e. 220_32 in FIG. 12. Afterwards, testing and repairing for the memory components in the both first semiconductor portions 402_1, 402_2 may be performed by the control circuit in the second semiconductor portion 404, as mentioned above.

Figure 13:
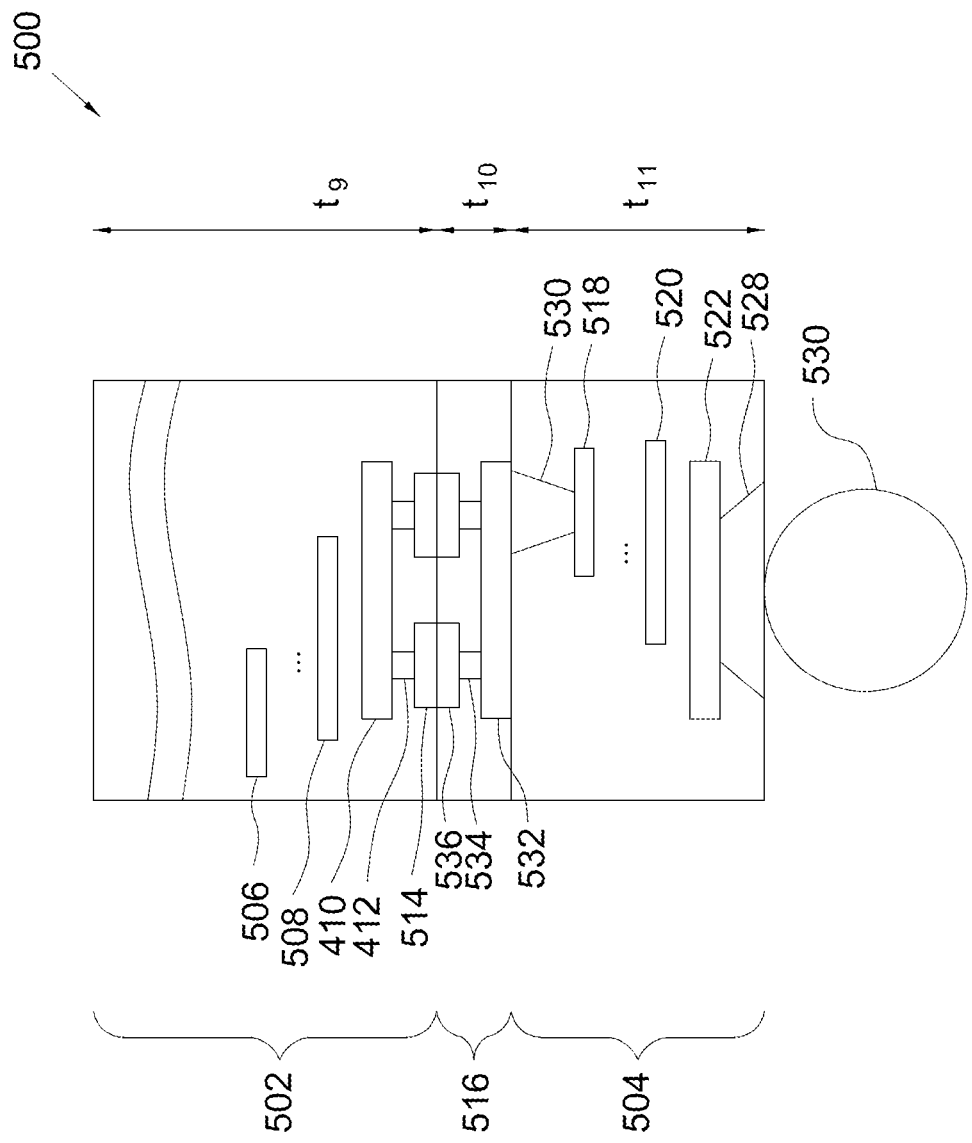
FIG. 13 shows a cross sectional view of a semiconductor device according to a seventh embodiment of the present invention.

FIG. 13 is a cross sectional view of a semiconductor device 500 according to a seventh embodiment of the present invention. The semiconductor device 500 comprises a first semiconductor portion 502, a second semiconductor portion 504, and a third semiconductor portion 516. According to the embodiment, the first semiconductor portion 502 and the second semiconductor portion 504 are similar to the first semiconductor portion 102 and the second semiconductor portion 104 of FIG. 2, the third semiconductor portion 516 is similar to the third semiconductor portion 416 of FIG. 10, thus the detailed description is omitted here for brevity. The second semiconductor portion 504, the third semiconductor portion 516, and the first semiconductor portion 502 are stacked vertically and sequentially. A plurality of memory components, the connecting lines of which may be constructed by a plurality of interconnect conductive layers 506, 508, 510, are formed in the first semiconductor portion 502, a control circuit, arranged to test and access the memory components, and/or a processing circuit, both of which may be constructed by a plurality of interconnect conductive layers 518, 520, 522, as mentioned in the above paragraphs are formed in the second semiconductor portion 504, and a plurality of conductive contacts 532, 536 electrically connected with a plurality of conductive vias 534 are formed on front and back surfaces of the third semiconductor portion 516. According to the embodiment, the first semiconductor portion 502 is arranged to comprise a plurality of conductive vias 512 and a plurality of conductive contacts 514 electrically connected to the top interconnect conductive layers 510. The second semiconductor portion 504 is arranged to comprise a plurality of TSV 528_1 electrically connected to the first interconnect conductive layer 518 without conductive vias and conductive contacts. The third semiconductor portion 516 is arranged to be an interconnecting structure for electrically connecting the conductive contacts 514 of first semiconductor portion 502 and the TSV 528_1 of the second semiconductor portion 504. Moreover, the second semiconductor portion 504 further comprises at least one TSV 528_2 formed through a front surface of the first wafer, in which one end of the TSV 528_2 is electrically connected to the top interconnect conductive layer 522, and the other end of the TSV 528_2 has a surface with the same level with the front surface of the first wafer. The TSV 528_2 is used as input/output channels to transmit signals in and from or supply power to the semiconductor device 500. According to the embodiment, the thickness $t_{11}$ of the second semiconductor portion 504 is smaller than the thickness $t_9$ of the first semiconductor portion 502.

Figure 14:
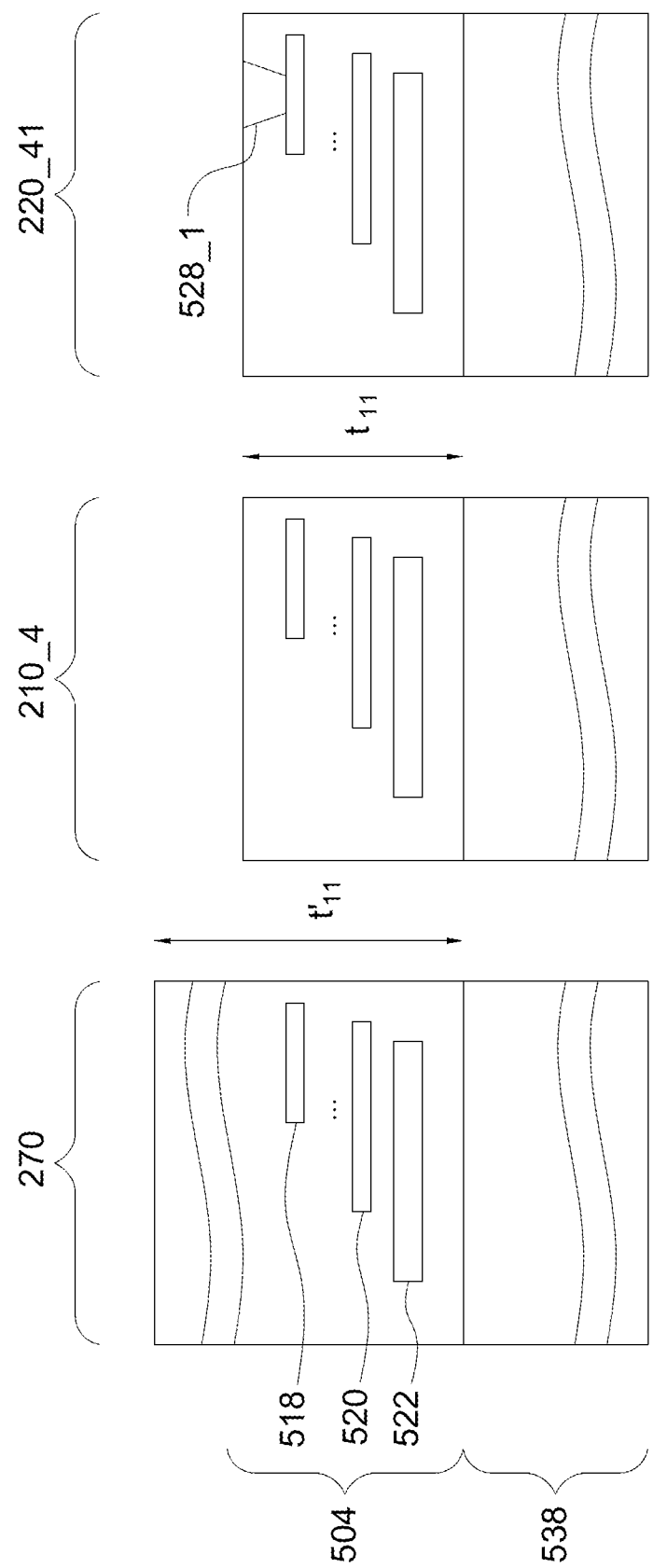

Please refer to FIGS. 14 and 15, which show a sectional view of bonded wafers during manufacturing the semiconductor device 400, as shown in FIG. 13, according to a flow chart of an eighth embodiment of the present invention. The semiconductor device 500 may be manufactured by two wafers, i.e., a first wafer and a second wafer, which may be similar to the wafer shown in FIG. 4. The first wafer may comprise the first semiconductor portion 502, the second wafer may comprise the second semiconductor portion 504. The third semiconductor portion 516 may be a hybrid bonding layer. According to the embodiment, the first semiconductor portion 502 and the second semiconductor portion 504 are similar to the first semiconductor portion 102 and the second semiconductor portion 104 of FIG. 2, except that no conductive contacts and conductive vias are formed above the top interconnect conductive layer 522 but instead of TSV 528_2 and metal bumps 530, thus the detailed description is omitted here for brevity. A front surface of the second wafer may be bounded with a carrier wafer 538, i.e. 270 in FIG. 14. Then, the second wafer is then thinned from the thickness $t'_{11}$ to the thickness $t_{11}$, i.e. 210_4 in FIG. 14. Then, a plurality of TSV 528_1 electrically connected to the control circuit and exposed at a back surface of the second semiconductor portion 504 are formed, i.e. 220_41 in FIG. 14. Then, a hybrid bonding layer (i.e. 516) is formed on the back surface of second wafer (i.e. 504), and the conductive contacts 532 may be electrically connected to the TSV 528_1. Then, another front-to-back stacking wafer-to-wafer bonding may be performed, so that the hybrid bonding layer (i.e. 516) may be stacked vertically with the first wafer, i.e. 200_4 in FIG. 15. The conductive contacts 514 may be electrically connected to the TSV 528_1 to form transmission channels to transmit signals between the first, second and third semiconductor portions 504, 516, 502. The carrier wafer is then removed from the second wafer, i.e. 280 in FIG. 15. Then, a plurality of input/output channels, here comprising TSV 528_2 and metal bumps (not shown) for example, are formed on the front surface of the second wafer, i.e. 220_42 in FIG. 15. Afterwards, testing and repairing for the memory components in the first semiconductor portions 502 may be performed by the control circuit in the in the second semiconductor portion 504, as mentioned above.

Therefore, compared with one of conventional technologies, the novel and comparatively simple structure and assembly procedure in which a first and second semiconductor portions comprising logic and memory components respectively are adapted to be stacked vertically, preferably fully overlapped, with one another according to the present invention, to provide data storage to the processing circuit and preferably carry out a great potential for the bandwidth of data transmission. A solution to test and repair the memory components without a probing damage onto the top interlayer conductive layer may present. Further, the control circuit may be integrated with the memory components by a wafer-to-wafer bonding process to preferably reduce the cost of production.

While various embodiments in accordance with the disclosed principles are described above, it should be understood that they are presented by way of example only, and are not limiting. Thus, the breadth and scope of example embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A method to manufacture a semiconductor device, comprising steps of:
    bonding a first wafer and a second wafer to be stacked vertically with one another, in which the first wafer provides a plurality of memory components and comprises a first substrate layer, a plurality of first interconnect conductive layers, a plurality of first conductive vias, and a plurality of first conductive contacts electrically connected to the first conductive vias, and the first conductive contacts in combination with the first conductive vias are formed on a top first interconnect conductive layer of the first interconnect conductive layers, and the second wafer provides a control circuit and comprises a second substrate layer and a plurality of second interconnect conductive layers;
    forming a plurality of input/output channels on a surface of one of the first and second wafers; and
    cutting the bonded first and second wafers into a plurality of dices;
    wherein the first conductive contacts are electrically connected to the control circuit and the first conductive contacts in combinations with the first conductive vias form a plurality of transmission channels through which the control circuit is capable to access the memory components.

2. The method according to claim 1, wherein the step of bonding the first wafer and the second wafer comprises a step of:
    performing front-to-front stacking wafer-to-wafer bonding to bond a front surface of the first wafer and a front surface of the second wafer.

3. The method according to claim 1, wherein the step of bonding the first wafer and the second wafer comprises steps of:
    bonding a third wafer to the first wafer such that the third wafer and the first wafer stack vertically with one another; and
    bonding a fourth wafer to the third wafer such that the fourth wafer and the third wafer stack vertically with one another;
    wherein the third wafer is electrically connected to the fourth and the first wafers.

4. The method according to claim 1, wherein each of the dices comprises a first semiconductor portion originated from the first wafer and a second semiconductor portion originated from the second wafer, and the method further comprises:
    testing the memory components in the first semiconductor portion by a control circuit in the second semiconductor portion through the transmission channels.

5. The method according to claim 4, further comprising:
    after the testing, enabling the replacement of a failed memory component of the memory components with an information stored in a failure storage space in the control circuit of the second semiconductor portion.

6. The method according to claim 1, further comprising:
    inline-testing the memory components by probing on a top surface of a second highest first interconnect conductive layer which is a first one below a top first interconnect conductive layer electrically connected to the first conductive contacts.

7. The method according to claim 1, wherein the step of forming the plurality of input/output channels on the surface of one of the first and second wafers comprises:

forming the input/output channels on a back surface of one of the first and second wafers.

8. The method according to claim 1, wherein the step of forming the plurality of input/output channels on a surface of one of the first and second wafers comprises:
    forming the input/output channels on a front surface of the second wafer.

9. The method according to claim 1, comprising a step of:
    thinning thickness of one of the first and second wafers to be thinner than the other one of the first and second wafers.

10. The method according to claim 1, wherein the second wafer further provides a plurality of second conductive vias and a plurality of second conductive contacts which are electrically connected to the second conductive vias, and the second conductive vias and the second conductive contacts are formed on a top second interconnect conductive layer of the second interconnect conductive layers, and the method further comprises:
    forming the transmission channels by electrically connecting the first and second conductive contacts.

11. The method according to claim 10, wherein the first conductive contacts are exposed at a front surface of the first wafer and electrically connect to the second conductive contacts which are exposed at a front surface of the second wafer.

12. The method according to claim 1, wherein the first conductive contacts are exposed at a front surface of the first wafer, and the method further comprises:
    forming a plurality of through silicon vias exposed at a back surface of the second wafer; and
    electrically connecting the first conductive contacts to the through silicon vias.

13. The method according to claim 12, wherein the through silicon vias electrically connect to a bottom second interconnect conductive layer of the second interconnect conductive layers.

14. The method according to claim 1, wherein the first conductive contacts are exposed at a front surface of the first wafer, and the method further comprises:
    forming a plurality of first through silicon vias to expose at a back surface of the first wafer;
    wherein the first through silicon vias are electrically connected to a plurality of bottom first interconnect conductive layer of the first interconnect conductive layers.

15. The method according to claim 14, further comprising:
    forming a hybrid bonding layer on the back surface of the first wafer;
    wherein the hybrid bonding layer comprises a plurality of second conductive contacts disposing on a first surface of the hybrid bonding layer, a plurality of third conductive contacts disposing on a second surface opposite to the first surface of the hybrid bonding layer, and a plurality of second conductive vias connecting the second conductive contacts and the third conductive contacts; and
    wherein the first surface of the hybrid bonding layer is attached to the back surface of the first wafer such that the first through silicon vias are electrically connected to the second conductive contacts.

16. The method according to claim 15, further comprising:
    providing a third wafer having a plurality of second memory components, a third substrate layer, and a plurality of third interconnect conductive layers;
    forming a plurality of third conductive vias and a plurality of fourth conductive contacts in the third wafer such that the fourth conductive contacts electrically connected to the third conductive vias;
    wherein the fourth conductive contacts in combination with the third conductive vias are formed on a top third interconnect conductive layer of the third interconnect conductive layers.

17. The method according to claim 16, wherein the fourth conductive contacts are exposed at a front surface of the third wafer, the method further comprises:
    forming a plurality of second through silicon vias in the third wafer and the second through silicon vias exposed at a back surface of the third wafer, and the second through silicon vias electrically connected to a plurality of bottom third interconnect conductive layer of the third interconnect conductive layers.

18. The method according to claim 17, further comprising:
    forming a plurality of metal bumps on the back surface of the third wafer such that the second through silicon vias are electrically connected to the metal bumps.

19. The method according to claim 18, wherein a thickness of the second wafer is greater than a thickness of the first wafer.

20. The method according to claim 18, wherein a thickness of the second wafer is greater than a thickness of the third wafer.

* * * * *